(12) United States Patent
Nielson

(10) Patent No.: US 12,080,651 B2
(45) Date of Patent: Sep. 3, 2024

(54) THREE-DIMENSIONAL MICRO-ELECTRO-MECHANICAL, MICROFLUIDIC, AND MICRO-OPTICAL SYSTEMS

(71) Applicant: Nielson Scientific, LLC, Lehi, UT (US)

(72) Inventor: Gregory Nolan Nielson, Lehi, UT (US)

(73) Assignee: NIELSON SCIENTIFIC, LLC, Lehi, UT (US)

( * ) Notice: Subject to any disclaimer, the term of this patent is extended or adjusted under 35 U.S.C. 154(b) by 806 days.

(21) Appl. No.: 17/040,430

(22) PCT Filed: Mar. 27, 2019

(86) PCT No.: PCT/US2019/024205
§ 371 (c)(1),
(2) Date: Sep. 22, 2020

(87) PCT Pub. No.: WO2019/191179
PCT Pub. Date: Oct. 3, 2019

(65) Prior Publication Data
US 2021/0020576 A1   Jan. 21, 2021

Related U.S. Application Data

(60) Provisional application No. 62/648,391, filed on Mar. 27, 2018, provisional application No. 62/711,333, filed on Jul. 27, 2018.

(51) Int. Cl.
*H01L 23/538* (2006.01)
*B81B 7/00* (2006.01)
(Continued)

(52) U.S. Cl.
CPC .......... *H01L 23/5384* (2013.01); *B81B 7/007* (2013.01); *B81B 7/0074* (2013.01);
(Continued)

(58) Field of Classification Search
CPC . H01L 23/5384; H01L 27/0688; B81B 7/007; B81B 7/0074; B81B 2203/0338;
(Continued)

(56) References Cited

U.S. PATENT DOCUMENTS

2002/0104317 A1   8/2002  Rakhmailov
2004/0101229 A1*  5/2004  Takagi ................... G02B 6/132
                                                              385/14
(Continued)

FOREIGN PATENT DOCUMENTS

WO        2019191179 A1     10/2019

OTHER PUBLICATIONS

"International Search Report and Written Opinion of the International Searching Authority for PCT Patent Application No. PCT/US2019/024205", Mailed Date: Jun. 13, 2019, 13 Pages.

*Primary Examiner* — John Bedtelyon
(74) *Attorney, Agent, or Firm* — CALFEE, HALTER & GRISWOLD LLP

(57) ABSTRACT

Various three-dimensional devices that can be formed within the bulk of a semiconductor by photo-controlled selective etching are described herein. With more particularity, semiconductor devices that incorporate three-dimensional electrical vias, waveguides, or fluidic channels that are disposed within a semiconductor are described herein. In an exemplary embodiment, a three-dimensional interposer chip includes an electrical via, a waveguide, and a fluidic channel, wherein the via, the waveguide, and the fluidic channel are disposed within the body of a semiconductor element rather than being deposited on a surface. The three-dimensional interposer is usable to make electrical, optical, or fluidic connections between two or more devices.

17 Claims, 22 Drawing Sheets

(51) Int. Cl.
*B81C 1/00* (2006.01)
*G02B 6/12* (2006.01)
*G02B 6/28* (2006.01)
*H01L 27/06* (2006.01)

(52) U.S. Cl.
CPC ...... *B81C 1/00119* (2013.01); *G02B 6/12002* (2013.01); *G02B 6/28* (2013.01); *H01L 27/0688* (2013.01); *B81B 2203/0338* (2013.01)

(58) Field of Classification Search
CPC ......... B81B 2203/0353; B81C 1/00119; B81C 2201/0133; G02B 6/12002; G02B 6/28; G02B 6/122; G02B 6/125; H05K 1/162; H05K 1/165; H05K 1/167; H05K 2201/064; H05K 2201/10378; H05K 1/0272

See application file for complete search history.

(56) References Cited

U.S. PATENT DOCUMENTS

| | | |
|---|---|---|
| 2004/0184755 A1 | 9/2004 | Sugiyama et al. |
| 2005/0241959 A1 | 11/2005 | Ward et al. |
| 2006/0087029 A1 | 4/2006 | Imanaka et al. |
| 2007/0104411 A1 | 5/2007 | Ahn et al. |
| 2009/0072334 A1 | 3/2009 | Saitoh |
| 2010/0243307 A1 | 9/2010 | McConnell et al. |
| 2010/0314041 A1 | 12/2010 | Ng et al. |
| 2011/0226807 A1 | 9/2011 | Essen et al. |
| 2013/0154053 A1 | 6/2013 | Yen et al. |
| 2013/0322813 A1 | 12/2013 | Grondin et al. |
| 2014/0355234 A1 | 12/2014 | Buuck |
| 2016/0109731 A1 | 4/2016 | Huang |
| 2017/0268523 A1 | 9/2017 | Zanotto Filho |
| 2017/0299902 A1 | 10/2017 | Yu et al. |
| 2018/0070869 A1 | 3/2018 | Ionescu et al. |

* cited by examiner

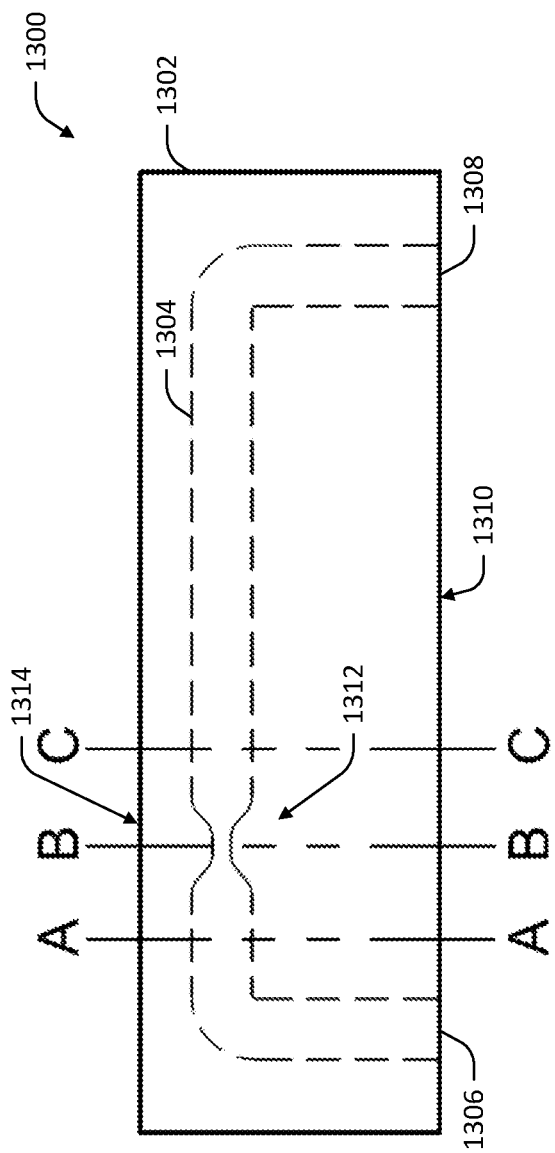
FIG. 13A
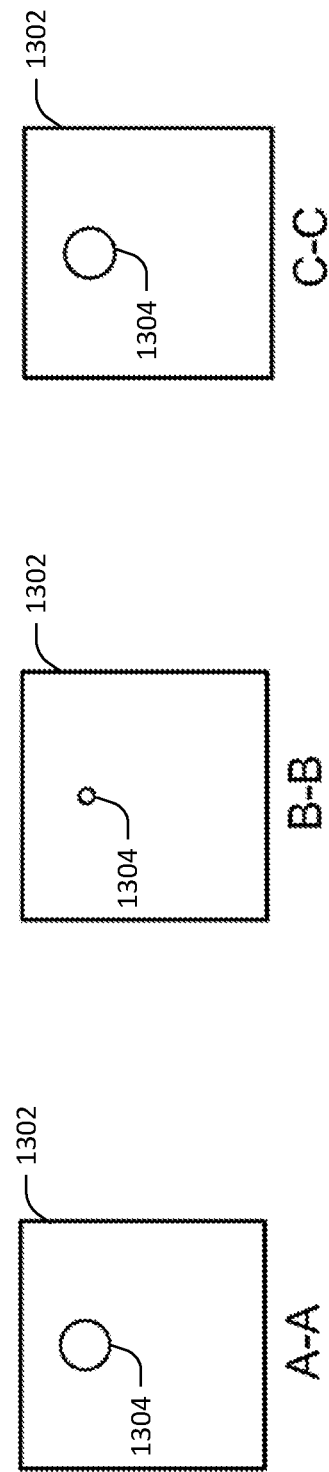
FIG. 13B
FIG. 13C
FIG. 13D

THREE-DIMENSIONAL MICRO-ELECTRO-MECHANICAL, MICROFLUIDIC, AND MICRO-OPTICAL SYSTEMS

RELATED APPLICATIONS

This application claims priority to U.S. Provisional Patent Application No. 62/648,391 filed on Mar. 27, 2018 and entitled "MULTI-FUNCTIONAL SEMICONDUCTOR CHIPS," and to U.S. Provisional Patent Application No. 62/711,333 filed on Jul. 27, 2018 and entitled "3D INTERPOSER CHIPS" the entireties of which are incorporated herein by reference.

BACKGROUND

Microfabrication refers to a variety of techniques that are used to manufacture integrated circuits (ICs) and micro-electro-mechanical systems (MEMS). ICs and MEMS manufactured by way of conventional microfabrication techniques have feature sizes on the order of microns or nanometers. Conventionally, microfabrication of ICs and MEMS is a layer-by-layer process wherein layers of semiconductors (and various other materials) are deposited, patterned with lithographic tools, and then etched to define a portion of the final geometry. Generally, these conventional microfabrication techniques are limited to creating structures with shapes that are analogous to two-dimensional extruded geometries, sometimes referred to as 2.5D.

SUMMARY

The following is a brief summary of subject matter that is described in greater detail herein. This summary is not intended to be limiting as to the scope of the claims.

Various technologies pertaining to fabrication of MEMS, microfluidic systems, and micro-optical systems are described herein. Technologies pertaining to interposers for ICs and other electrical, optical, and mechanical devices are also described herein, wherein an interposer is configured to facilitate electrical, optical, and fluid connections between two devices (e.g., ICs).

In one exemplary embodiment, a semiconductor device comprises a semiconductor element having a three-dimensional (3D) conductive via formed therein. The conductive via can be formed in the body of the semiconductor element to take substantially any path through the semiconductor element, rather than being limited to straight-through connections from a top surface to a bottom surface of the semiconductor element. By way of example, and not limitation, the conductive via can be formed in the body of the semiconductor element such that the ends of the via are laterally offset from one another where the ends terminate on surfaces of the semiconductor element.

In another exemplary embodiment, a semiconductor device comprises a semiconductor element having a 3D waveguide formed therein. The 3D waveguide can be formed in the body of the semiconductor element to take substantially any path through the semiconductor element. In a non-limiting example, the waveguide can be formed in the body of the semiconductor element such that the ends of the waveguide are laterally offset from one another where the ends terminate on surfaces of the semiconductor element.

In still another exemplary embodiment, a semiconductor device comprises semiconductor element having a 3D channel formed therein that is configured to accommodate a fluid. The fluidic channel can be formed in the body of the semiconductor element to take substantially any path through the semiconductor element. In one exemplary embodiment, the fluidic channel can be formed within the body of the semiconductor element such that the ends of the fluidic channel are laterally offset from one another where the ends terminate on surfaces of the semiconductor element.

Various configurations and combinations of 3D vias, waveguides, and fluidic channels can be employed to construct a variety of devices within the body of a semiconductor element. By way of example, and not limitation, a heat exchanger, a pump, an optical gyroscope, a capacitor, or an inductor can be formed within the body of a semiconductor element. Other devices are contemplated as being within the scope of the present disclosure. In an example, a 3D interposer comprises a semiconductor element that includes a 3D via, a 3D waveguide, and a 3D fluidic channel. The exemplary 3D interposer can be used to form electrical, optical, and fluidic connections between two or more devices, such as integrated circuits, or any of various devices described herein below.

Various technologies pertaining to fabrication of structures in a semiconductor by way of selective etching of the semiconductor are also described herein. These technologies are suitable for manufacturing a variety of 3D structures in a semiconductor (e.g., three-dimensional voids). Furthermore, these technologies are suitable for etching structures in a semiconductor with smaller feature sizes than are typically possible with conventional selective etching techniques. The selective semiconductor etching technologies described herein can be used to fabricate three-dimensional electrical vias, waveguides, and fluidic channel structures.

In various exemplary embodiments, a semiconductor is etched by way of electrochemical reactions at a surface of the semiconductor that is exposed to an etchant solution. The exposed surface of the semiconductor is etched selectively based upon controlled creation of holes in the atomic lattice of the semiconductor (i.e., absences of electrons in the lattice that are commonly modeled as positively-charged particles called holes). In the etching reaction, holes at the exposed surface of the semiconductor cause oxidation of the semiconductor, which oxidation is subsequently etched by the etchant solution. Holes are selectively created by illumination of the semiconductor by an illumination source (e.g., a laser) that has an energy below the bandgap energy of the semiconductor. Single sub-bandgap energy photons do not have sufficient energy to move electrons in the semiconductor from the valence band to the conduction band. Thus, ordinarily sub-bandgap energy light is unable to create holes in the atomic lattice of the semiconductor. The sub-bandgap energy light emitted by the illumination source is focused to a sufficiently intense focal spot to cause multi-photon absorption (MPA) within the semiconductor. When this occurs, the photon energy of multiple photons is combined to exceed the bandgap energy of the semiconductor, exciting electrons from the valence band to the conduction band and thereby creating holes in the atomic lattice of the semiconductor at the focal spot of the illumination source. Holes can be selectively created in a region near the focal spot of the illumination source where etching is desirably performed, thereby limiting the etching to a region near the focal spot.

Since the light emitted by the illumination source is sub-bandgap-energy light that does not experience linear absorption, the semiconductor is transparent to the light emitted by the illumination source. By moving the focal spot of the illumination source within the body of the semiconductor, etching of the semiconductor can be selectively controlled to occur at positions that cannot be etched according to conventional semiconductor etching methods. Three-dimensional features can therefore be etched within the body of the semiconductor that are not readily created by conventional microfabrication techniques. In an exemplary embodiment, the illumination source can be positioned facing a second surface (e.g., a backside surface) of the semiconductor opposite the surface exposed to the etchant solution. In the embodiment, the illumination source emits light toward the second surface of the semiconductor and through the semiconductor to the focal spot within the semiconductor body. Illumination of the semiconductor through the second surface opposite the etching surface avoids potential scattering of the emitted light, which can cause undesired etching of the semiconductor or can lower achievable resolution of semiconductor features.

In other exemplary embodiments, the illumination source is controlled by way of a computing device that incorporates a physics model of charge-carrier transport within the semiconductor. In general, a hole generated at a first location in a semiconductor can move within the semiconductor subject to various forces caused by electric fields, carrier diffusion etc. In some instances, therefore, holes created at the first location in the semiconductor may move to a location in the semiconductor other than a location that is desirably etched. By incorporating a physics model of charge-carrier transport, the computing device can control the illumination source such that holes are created by the emitted light at locations where they will ultimately migrate to desired etching locations. By way of example, the computing device is provided with a desired etch location in the semiconductor. The computing device outputs a prediction based upon the physics model, where the prediction indicates that a hole created at a first location is expected to migrate to the desired etch location. The physics model can output the prediction based upon charge-carrier diffusion in the semiconductor, an electric field applied to the semiconductor (e.g., by way of a bias voltage), and a current flow in the electrochemical cell that drives the etching reaction. The computing device then controls the output of the illumination source to cause the illumination source to illuminate the semiconductor with its focal spot at the first location predicted by the physics model.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF THE DRAWINGS

FIG. 13A is a side view of an exemplary fluidic channel structure that includes an expansion nozzle.

FIGS. 13B-13D are cross-sectional views of the exemplary fluidic channel structure of FIG. 13A.

DETAILED DESCRIPTION

Figure 1A:
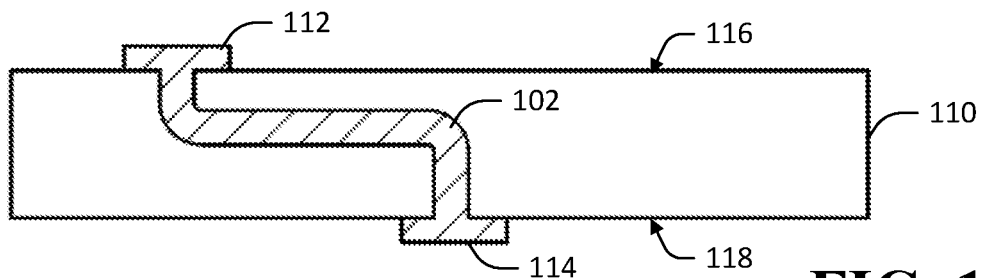
FIGS. 1A-1C are diagrams of various 3D via structures.

Various technologies pertaining to 3D MEMS, microfluidic, and micro-optical devices that can be manufactured by photo-controlled selective semiconductor etching are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

It is to be understood that as used herein, a "hole" in a semiconductor lattice refers to the absence of an electron at a location in the semiconductor lattice. While reference is made herein to various acts and occurrences relative to holes as tangible entities, it is to be understood that such explanation is merely intended to facilitate understanding of various aspects, and may reflect some inaccuracy in an underlying physical process. For instance, while reference is made herein to electric fields exerting forces on holes and causing hole motion, it is to be understood that electric fields actually exert forces on electrons in a semiconductor lattice thereby causing electron motion, whereas results of such motion may be suitably described by conceptualizing a hole as a virtual particle. Such references to holes are made in order to facilitate understanding, and are consistent with descriptions commonly employed in the art of semiconductor fabrication.

Figure 1B:
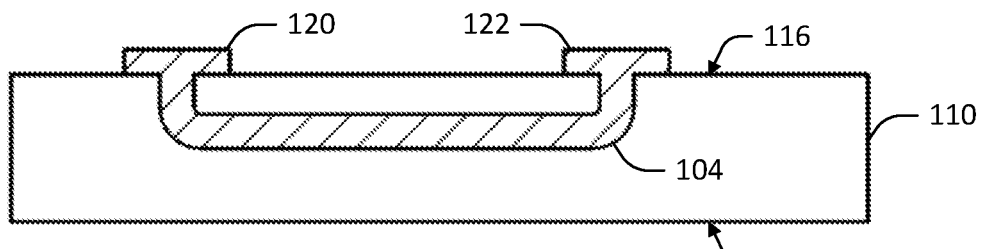
Figure 1C:
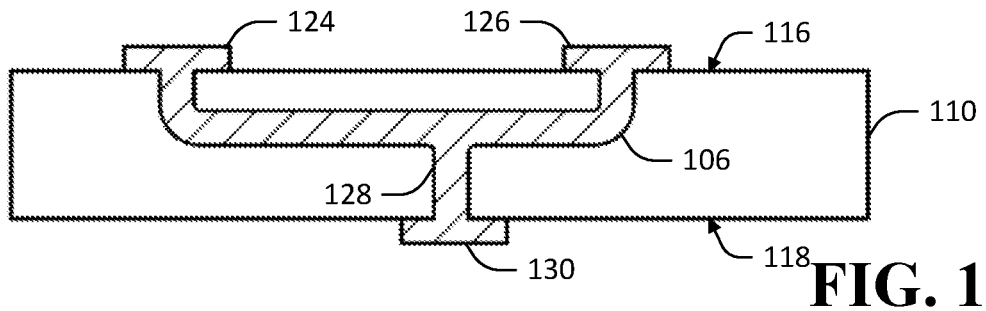

Referring now to FIGS. 1A-1C, a plurality of cross-sectional side views of exemplary vias 102-106 are shown, wherein the vias 102-106 have terminal ends that are laterally offset from one another. For example, and referring now solely to FIG. 1A, a via 102 is shown, wherein the via 102 is disposed within a bulk semiconductor element 110. The bulk semiconductor element 110 can be, for example, a layer of semiconductor material. In an exemplary embodiment, the bulk semiconductor element 110 is a semiconductor substrate on which an IC is deposited. The via 102 can be composed of a substantially solid conductive material or can be composed of a substantially solid conductive material with a dielectric, or non-conductive, material as a sleeve in-between the solid conductive material and the surrounding bulk semiconductor for enhanced electrical isolation. The via 102 has a first terminal portion 112 and a second terminal portion 114. The bulk semiconductor element 110 has a first surface 116 and a second surface 118 opposite the first surface 116. The first terminal portion 112 of the via 102 terminates at the first surface 116. The second terminal portion 114 of the via 102 terminates at the second surface 118 such that the first terminal portion 112 and the second terminal portion 114 are laterally offset from one another. Stated differently, the via 102 does not follow a straight vertical path from the first terminal portion 112 to the second terminal portion 114. In exemplary embodiments, the first terminal portion 112 and the second terminal portion 114 define respective pads on the surfaces 116, 118 of the bulk semiconductor element 110.

In other embodiments, a via can be configured such that its terminal portions terminate on a same side of a bulk semiconductor element. By way of example, and with reference now to FIG. 1B, the via 104 is depicted being disposed in the bulk semiconductor element 110 such that a first terminal portion 120 of the via 104 and a second terminal portion 122 of the via 104 terminate on the same first surface 116 of the bulk semiconductor element 110. The via 104 extends between the first terminal portion 120 and the second terminal portion 122 beneath the surface 116 of the bulk semiconductor element 110. Accordingly, the terminal portions 120, 122 of the via 104 are electrically connected without requiring a trace between the terminal portions 120, 122 to be placed on the surface 116 or within surface films of the bulk semiconductor element 110.

In various embodiments, a via can be configured to include a branch with its own terminal portion such that the via has more than two terminal portions that terminate on surfaces of a semiconductor element. By way of example, and with reference now to FIG. 1C, via 106 has three terminal portions. For instance, and referring now solely to FIG. 1C, the via 106 is depicted as being disposed within the bulk semiconductor element 110, wherein the via 106 comprises a first terminal portion 124, a second terminal portion 126, and a branch 128 that includes a third terminal portion 130. The first terminal portion 124 and the second terminal portion 126 terminate on the same first side 116 of the bulk semiconductor element 110. The third terminal portion 130 terminates on the second side 118 of the bulk semiconductor element 110.

Any of the vias 102-106 can be formed in the bulk semiconductor element 110 by selective etching of the bulk semiconductor element 110 to create a void having the desired shape of the via within the bulk semiconductor element 110. In exemplary embodiments, the selective etching can be performed as described below with respect to FIGS. 19-28. Subsequent to the void being created, a conductive material can be deposited in the void to fill the void, thereby completing the via. The conductive material can be deposited according to any of various deposition methods including, but not limited to, atomic layer deposition (ALD), chemical vapor deposition (CVD), and the like. In some instances, an electrically insulating material can be deposited on the interior surface of the void prior to filling the void with a conductive material to enhance electrical isolation between the via and the bulk semiconductor surrounding the via. This insulating material could be an oxide, such as silicon oxide, formed through an oxidation process. The insulating material could also be other insulating materials that are deposited using other methods such as ALD, CVD, or other conformal thin film deposition process. After forming or depositing the insulating film, the conductive material can be deposited using ALD, CVD, or other process. The cross-section of the via structures formed with selective etching process can be round, square, flat, or other shapes depending on what is optimal for the particular via.

Figure 2:
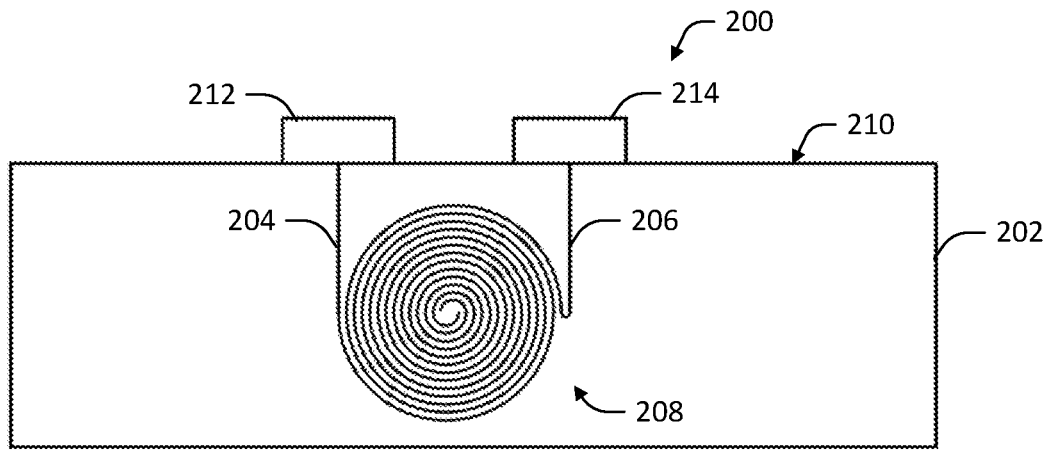
FIG. 2 is a diagram of an exemplary capacitor formed within the body of a semiconductor element.

Various other electrical components can be formed within the bulk material of a semiconductor element. By way of example, and referring now to FIG. 2, a capacitor 200 is shown disposed within a bulk semiconductor element 202. The capacitor 200 comprises a first conductive element 204 and a second conductive element 206 that are disposed in a spiral configuration 208 such that the conductive elements 204, 206 are substantially parallel to one another within the spiral 208. Within the spiral 208, the conductive elements 204, 206 can be separated by material of the bulk semiconductor element 202. In other exemplary embodiments, the conductive elements 204, 206 can be separated by a dielectric material or by dielectric or insulating layers and the bulk semiconductor material where the insulating layers are at the interface between the conductive material and the bulk semiconductor material. The conductive elements 204, 206 terminate on a surface 210 of the bulk semiconductor element 202. The conductive elements 204, 206 can be connected to respective conductive pads 212, 214 that are deposited on the surface 210 of the bulk semiconductor element 202 or can be connected directly to other electronic elements on or in the chip (i.e., "integrated").

Figure 3:
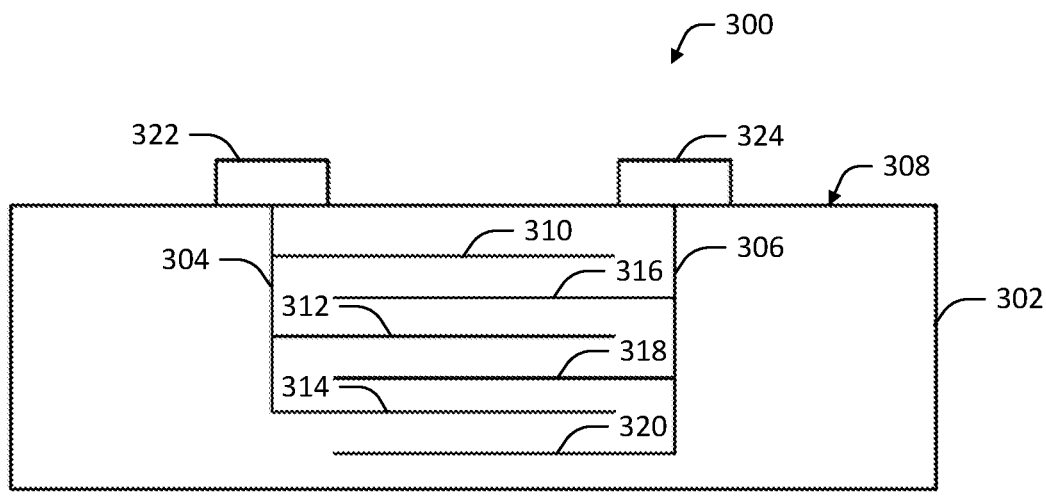
FIG. 3 is a diagram of another exemplary capacitor formed within the body of a semiconductor element.

Referring now to FIG. 3, another exemplary capacitor 300 is shown disposed within a bulk semiconductor element 302. The capacitor 300 comprises a first conductive element 304 and a second conductive element 306 that are each disposed within the bulk semiconductor element 302 (e.g., beneath a surface 308 of the bulk semiconductor element 302). The first conductive element 304 comprises a first plurality of plates 310-314. The second conductive element 306 comprises a second plurality of plates 316-320. The first plurality of plates 310-314 and the second plurality of plates 316-320 are interleaved in an alternating pattern. By way of example, the plates 310-320 are arranged such that the plate 310 faces the plate 316, which plate 316 in turn faces the plate 312. The plate 312 faces the plate 318, which in turn faces the plate 314. Finally, the plate 314 faces the plate 320. The first conductive element 304 and the second conductive element 306 terminate on the surface 308 of the bulk semiconductor element, and are connected to respective conductive pads 322, 324.

Figure 4:
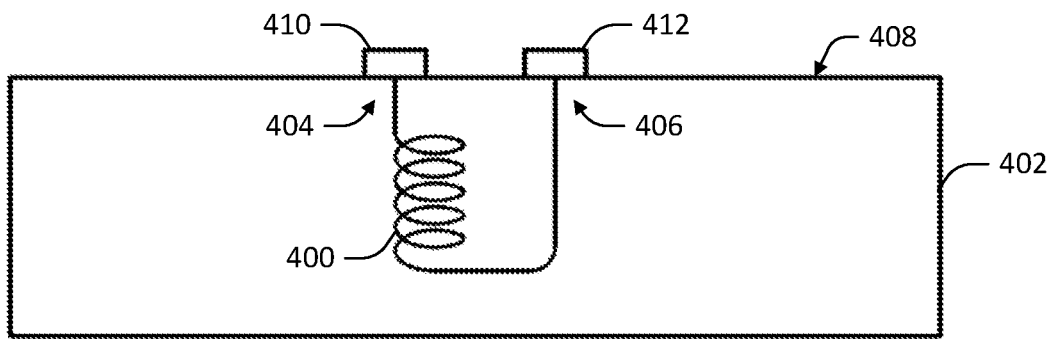
FIG. 4 is a diagram of an exemplary conductive coil formed within the body of a semiconductor element.

Referring now to FIG. 4, an exemplary conductive coil 400 is shown, wherein the conductive coil 400 is disposed within a bulk semiconductor element 402. The conductive coil 400 includes a first terminal end 404 and a second terminal end 406 that each terminate on a surface 408 of the bulk semiconductor element 402. The first terminal end 404 can be connected to a first conductive pad 410 that is disposed on the surface 408 of the bulk semiconductor element 402. The second terminal end 406 can be connected a second conductive pad 412 that is disposed on the surface 408 of the bulk semiconductor element 402. The conductive coil 400 can be used as an inductor, a resistor, a component in a transformer, an electromagnetic coil in an electric machine (e.g., a motor or generator), etc.

Any of the various devices 200, 300, 400 can be included in a bulk semiconductor element that also includes a via such as the vias 102-106.

Figure 5A:
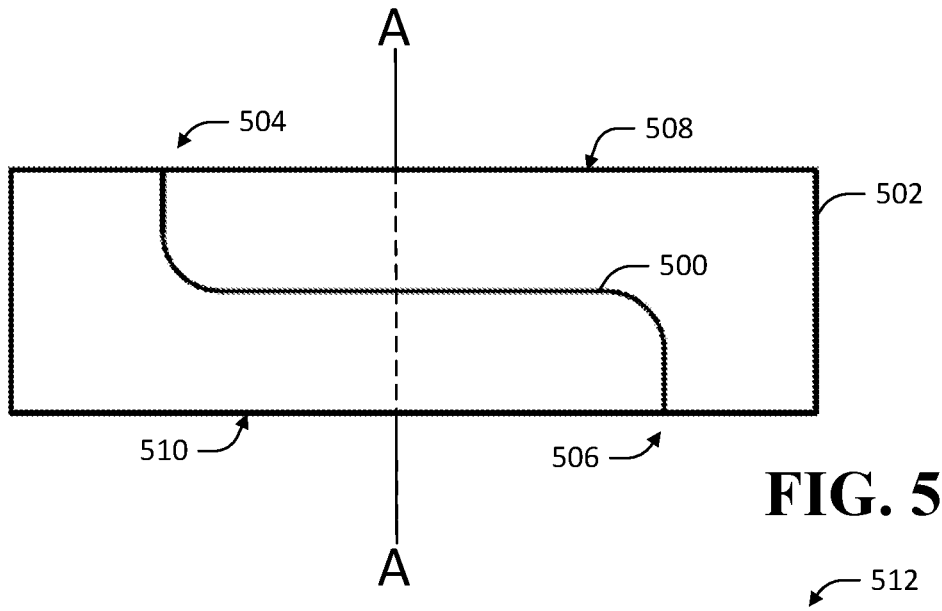
FIG. 5A is a side view of an exemplary waveguide disposed within the body of a semiconductor element.

Integrated micro-optical devices can also be created using selective semiconductor etching technologies described herein. With reference now to FIG. 5A, an exemplary waveguide 500 is depicted, wherein the waveguide 500 is disposed within a bulk semiconductor element 502. The waveguide has a first end 504 and a second end 506. The first end 504 of the waveguide 500 terminates on a first surface 508 of the bulk semiconductor element 502. The second end 506 of the waveguide 500 terminates on a second surface 510 of the bulk semiconductor element 502. The second end 506 terminates on the second surface 510 such that the second end 506 is laterally offset from the first end 504. The waveguide 500 follows a curved path through the bulk semiconductor element 502. It is to be understood, however, that other geometries of a waveguide disposed within a semiconductor element are contemplated. For example, the waveguide could follow a straight diagonal path through a semiconductor element, such that waveguide is not oriented normal to a surface of the semiconductor element.

Figure 5B:
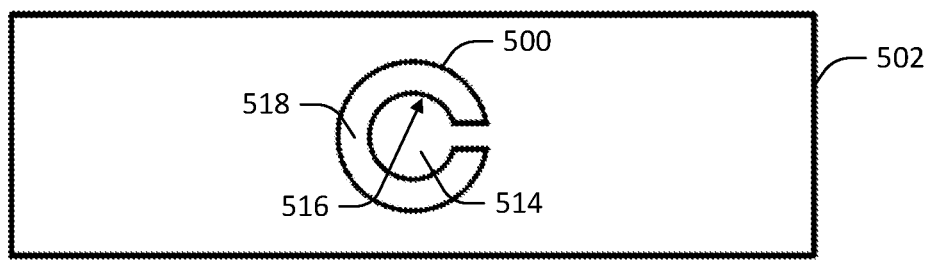
FIG. 5B is a cross-sectional view of the exemplary waveguide shown in FIG. 5A.
Figure 6:
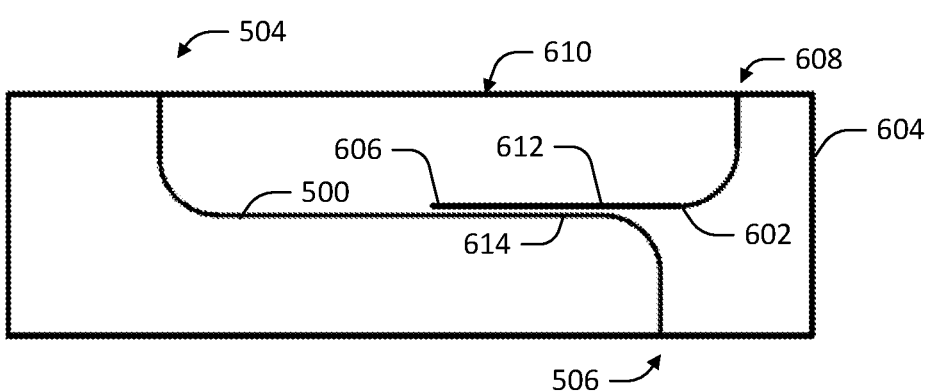
FIG. 6 is a diagram of an exemplary waveguide splitter structure formed within the body of a semiconductor element.

Referring now to FIG. 5B, a cross-sectional view 512 of the waveguide 500 is shown, wherein the cross-sectional view 512 is a view of the waveguide 500 and the bulk semiconductor element cut along a line A-A depicted in FIG. 5A. As shown in the cross-sectional view 512, the waveguide 500 can have a C-shaped cross section that defines a core 514 of material that is part of the bulk semiconductor element 502. The waveguide 500 has an interior surface 516 that surrounds the core 514. The waveguide 500 has a a body 518 that surrounds the core 514. In exemplary embodiments, the body 518 of the waveguide 500 is composed of a material having a lower index of refraction than the semiconductor material that makes up the bulk semiconductor element 502. The material comprising body 518 could be a lower index solid material or could be open (e.g., a vacuum or gas) or could be intentionally filled with a fluid. Accordingly, the waveguide 500 can constrain light to travel along the waveguide 500 within the core 514 of the waveguide. As noted above with respect to the vias 102-106, the body 518 of the waveguide 500 can be formed by selective etching of the bulk semiconductor element 502 to create a void having the desired shape of the body 518, in accordance with technologies described below with respect to FIGS. 19-28. Material making up the waveguide body 518 can then be deposited in the created void according to any of various deposition techniques or left open to be a vacuum or filled with gas or liquid. It further is to be understood that the waveguide 500 could be configured to have a different cross-section. By way of example, the waveguide 500 could be configured to have a rectangular cross-section, a circular cross-section, or substantially any other desirable waveguide geometry. In exemplary embodiments the waveguide 500 can be configured to be a photonic crystal waveguide, a rib waveguide, or other type of waveguide With reference now to FIG. 6, an exemplary semiconductor device 600 is shown wherein the semiconductor device 600 comprises the waveguide 500 and a second waveguide 602 each disposed within a bulk semiconductor element 604. The second waveguide 602 comprises a first end 606 and a second end 608, wherein the first end 606 terminates within the bulk semiconductor element 604 and the second end terminates on a surface 610 of the bulk semiconductor element 604. The second waveguide 602 is positioned so that the first end 606 is located proximal to the first waveguide 500, such that light that passes through the first waveguide 500 is evanescently coupled into the second waveguide 602. By way of example, a span 612 that extends from the first end 606 of the waveguide 602 can be positioned parallel to a span 614 of the first waveguide 500 such that the span 612 of the second waveguide 602 and the span 614 of the first waveguide 500 are in proximity to one another (e.g., within 5 microns, within 1 micron, or within 500 nanometers). The device 600 can therefore serve as an optical splitter, wherein an optical signal that enters the waveguide 500 at the first end 504 of the waveguide is split between the span 614 of the first waveguide and the span 612 of the second waveguide 602 by evanescent coupling of the waveguides 500, 602. The split optical signal is then output by way of the second end 506 of the first waveguide 500 and the second end 608 of the second waveguide 602. Other exemplary splitter structures also include a "Y" splitter where a waveguide is split directly into two or more waveguides. Furthermore, a similar evanescent coupling structure illustrated in FIG. 6 can be used to couple multiple optical ring resonators together or to couple light from ring resonators to input and output waveguides to create optical filters.

Figure 7:
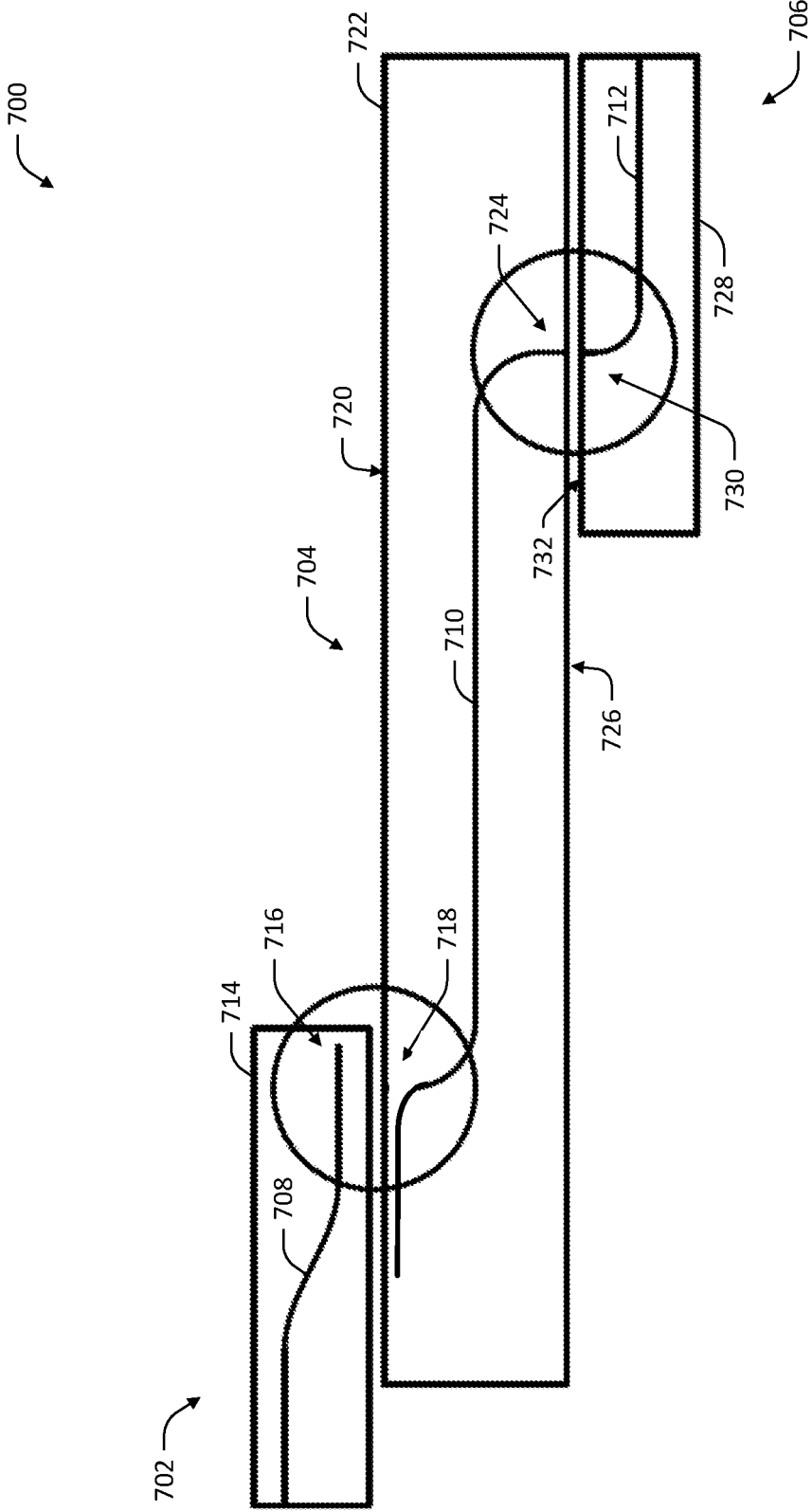
FIG. 7 is a diagram of an exemplary device that includes a plurality of semiconductor chips that each have a waveguide disposed therein.
Figure 8:
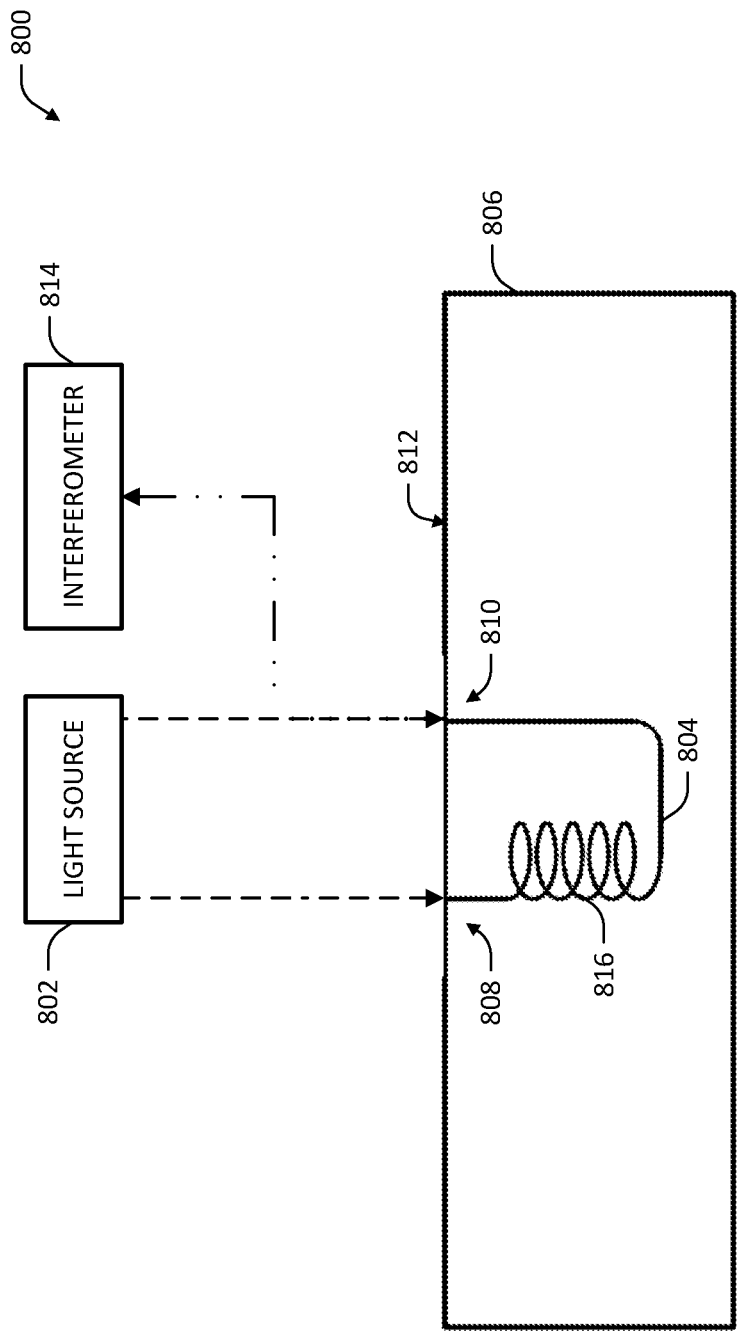
FIG. 8 is a diagram of an exemplary optical gyroscope.

With reference now to FIG. 7, another exemplary semiconductor device 700 is shown, wherein the device 700 includes a plurality of semiconductor chips 702-706 each of which includes a respective waveguide 708-712. The waveguide 708 is disposed within a bulk semiconductor element 714 of the semiconductor chip 702 such that one end 716 of the waveguide 708 terminates within the bulk semiconductor element 714. The waveguide 710 has a first end 718 that is disposed near a surface 720 of a bulk semiconductor element 722 of the semiconductor chip 704. The semiconductor chip 702 can be placed proximally to the semiconductor chip 704 such that the portion of waveguide 708 near the end 716 of the waveguide 708 is in proximity to the parallel portion of waveguide 710 near the first end 718 of the waveguide 710. Light in the waveguide 708 couples to the waveguide 710 by way of evanescent coupling between the parallel portions of the waveguide near the ends 716, 718.

The waveguide 710 further includes a second end 724 that terminates on a second surface 726 of the semiconductor element 722. The waveguide 712 is disposed within a bulk semiconductor element 728. The waveguide 712 has a first end 730 that terminates on a surface 732 of the bulk semiconductor element 728. The semiconductor chips 704, 706 are positioned such that the second end 724 of the waveguide 710 is aligned with the first end 730 of the waveguide 712. The waveguides 710, 712 are therefore coupled by end-coupling at their respective ends 724, 730.

The semiconductor device 700 therefore illustrates optical coupling among multiple semiconductor chips 702-706, each of which can include additional circuitry configured to perform one or more of various functions. By way of example, the semiconductor chip 704 can serve as an optical interposer between electro-optical circuits included on the semiconductor chips 702, 706.

In other embodiments, a waveguide disposed within the body of a bulk semiconductor element can be configured to function as part of a ring resonator or oscillator, an optical gyroscope based upon the Sagnac effect, or other optical device. By way of example, an exemplary optical gyroscope 800 is illustrated. The optical gyroscope 800 comprises a light source 802 (e.g., a light emitting diode, a laser diode, or the like) that is coupled to a waveguide 804. The waveguide 804 is disposed within a bulk semiconductor element 806. The waveguide 804 has a first end 808 and a second 810 that each terminate on a surface 812 of the bulk semiconductor element 806. The light source 802 emits light into each of the ends 808, 810 of the waveguide 804. The optical gyroscope 800 further comprises an interferometer 814 that is coupled to at least one of the ends 808, 810 of the waveguide 804. The waveguide 804 includes a looped coil 816 that has a plurality of loops. Due to the Sagnac effect, rotation of the semiconductor element 806 that includes the waveguide 804 results in a phase shift between the light emitted into each end 808, 810 of the waveguide 804. The interferometer 814 can detect the phase shift and output data indicative of rotation of the semiconductor element 806. While the light source 802 and the interferometer 814 are depicted as separate discrete components, it is to be understood that the laser and the interferometer can instead be implemented as integrated components deposited on or disposed within the semiconductor element 806. In other embodiments, the light source 802 and the interferometer 814 can be included in a separate integrated optical circuit that is optically coupled to the waveguide 804 in accordance with optical coupling techniques described herein.

Figure 9A:
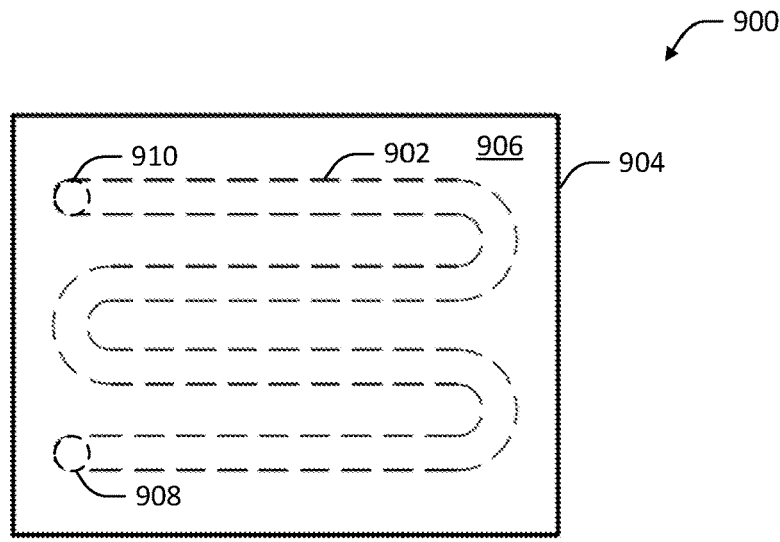
FIG. 9A is a top view of an exemplary heat exchange structure.
Figure 9B:
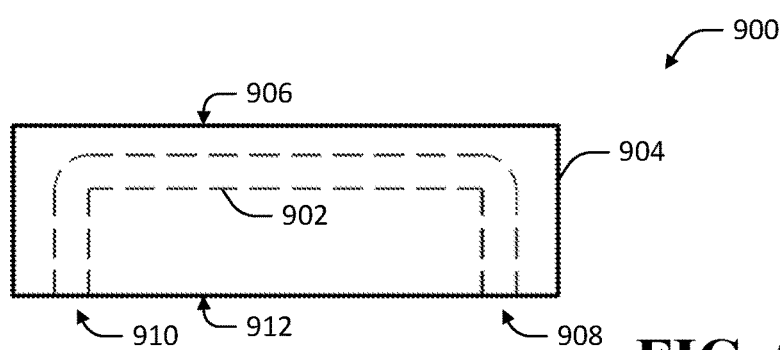
FIG. 9B is a side view of the exemplary heat exchange structure of FIG. 9A.

Selective semiconductor etching can also be used to create channels in a semiconductor element that can accommodate flow of a fluid. Accordingly, structures can be formed in the interior of a semiconductor element that can be used to facilitate heat transfer between a fluid and various components deposited on or in the semiconductor element. By way of example, and referring now to FIGS. 9A and 9B, an exemplary semiconductor device 900 is illustrated, wherein the semiconductor device 900 includes a channel 902 formed within a bulk semiconductor element 904, the channel 902 configured to accommodate a fluid. FIG. 9A depicts a top view of the semiconductor device 900, wherein an arrangement of the channel 902 beneath a top surface 906 of the semiconductor element 904 is depicted. FIG. 9B depicts a side view of the semiconductor device 900. The channel 902 comprises an inlet 908 and an outlet 910 that both terminate on a bottom surface 912 of the semiconductor element 904. As shown in FIG. 9A, the channel 902 follows a switchback path that winds through the semiconductor element 904 near the top-surface 906 of the semiconductor element 904. In an exemplary embodiment, the inlet 908 and the outlet 910 of the channel 902 can be connected to a pump (not shown). The pump can be configured to pump a fluid through the channel 902, either in a liquid phase or a gaseous phase. As the fluid flows through the channel 902, heat can be transferred from the semiconductor material in the vicinity of the channel 902 to the fluid. Accordingly, since the channel 902 is positioned inside the semiconductor element 904 in the vicinity of the top surface 906 of the semiconductor element 904, pumping a fluid through the channel 902 can facilitate cooling of elements and devices deposited on the surface 906 (e.g., transistors, integrated circuit, and the like). By locating the channel 902 within semiconductor device 900, which can be a bulk semiconductor device comprised of single-crystal material with no bonding interfaces, the thermal conductivity from the semiconductor device 900 to the fluid within channel 902 is enhanced.

Figure 10:
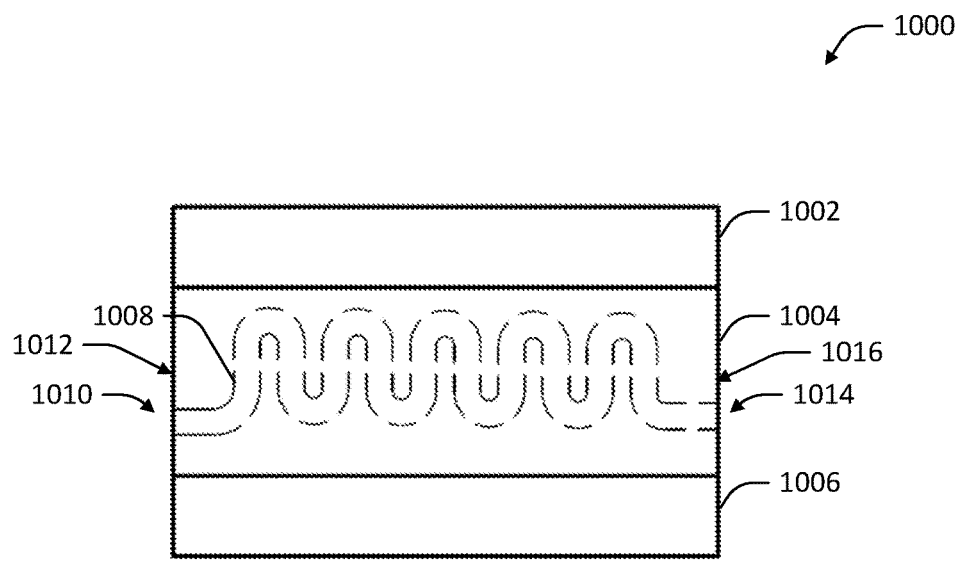
FIG. 10 is a side view of another exemplary heat exchange structure.

With reference now to FIG. 10, another exemplary device 1000 that facilitates cooling of semiconductor devices is illustrated. The device 1000 includes an integrated circuit 1002, a bulk semiconductor element 1004 positioned beneath the integrated circuit 1002, and a heatsink/cooler 1006 that is positioned beneath the bulk semiconductor element 1004. In various embodiments, the heatsink/cooler 1006 can be solid thermally conductive material. In other embodiments, the heatsink/cooler 1006 can be an active thermoelectric cooler. The bulk semiconductor element 1004 has a channel 1008 formed therein. The channel 1008 is configured to accommodate a flow of fluid therethrough. The channel 1008 includes an inlet 1010 that terminates on a surface 1012 of the bulk semiconductor element 1004, and an outlet 1014 that terminates on another surface 1016 of the bulk semiconductor element 1004. It is to be understood, however, that the inlet 1010 and the outlet 1014 could be configured to terminate on the same surface of the bulk semiconductor element 1004. The channel 1008 has a winding shape such that as fluid flows through the channel 1008 the fluid alternately moves toward and away each of the integrated circuit 1002 and the heatsink/cooler 1006. The integrated circuit 1002 can include a plurality of electrical components each of which dissipates some portion of its supplied power as heat. As a fluid flowing within the channel 1008 approaches the integrated circuit 1002, heat given off from the components of the integrated circuit is conducted through the bulk semiconductor element 1004 and into the fluid. As the fluid in the channel 1008 approaches the heatsink/cooler 1006, heat is transferred from the fluid into the heatsink/cooler 1006 by way of the bulk semiconductor material 1004. Therefore, as the fluid flows from the inlet 1010 to the outlet 1014 within the channel 1008, the fluid facilitates heat transfer between the integrated circuit 1002 and the heatsink/cooler 1006, thereby improving cooling of the integrated circuit 1002. Since excess heat generated during operation can be a limiting factor on operating performance of an integrated circuit, the improved cooling provided by the device 1000 can improve the performance of the integrated circuit 1002.

Figure 11A:
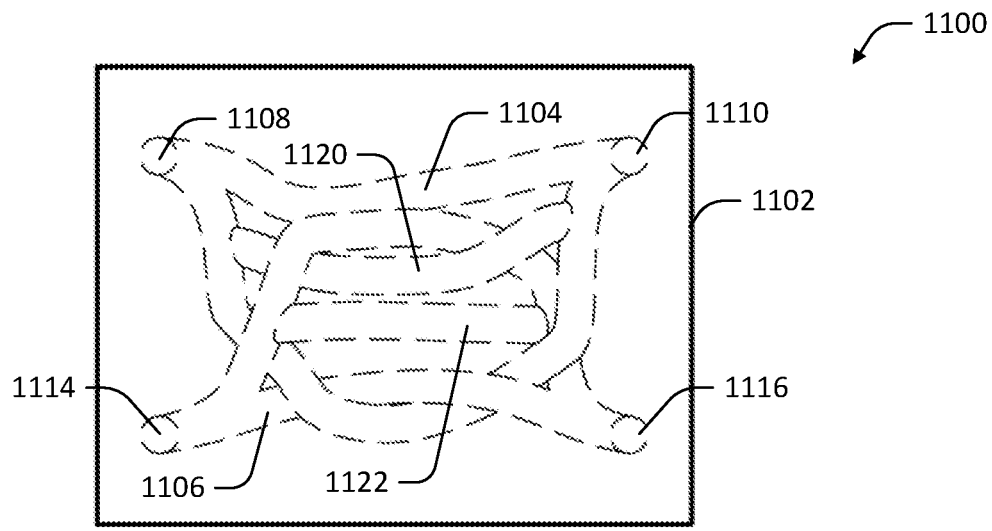
FIG. 11A is a top view of still another exemplary heat exchange structure.
Figure 11B:
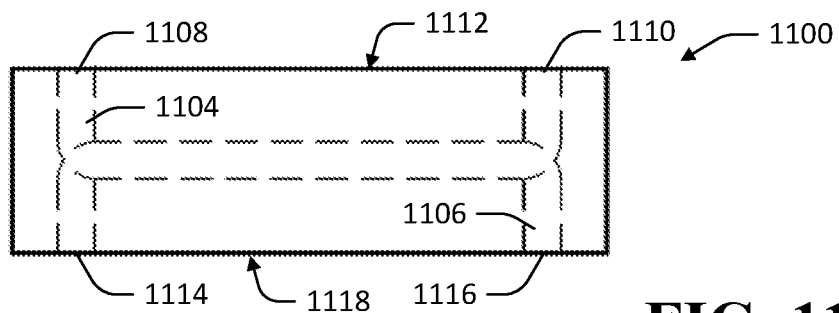
FIG. 11B is a side of the heat exchange structure of FIG. 11A.

In some embodiments, multiple channels can be formed within a same semiconductor element to accommodate heat transfer between multiple fluids within the semiconductor element. Referring now to FIGS. 11A and 11B, an exemplary heat exchanger device 1100 is shown, wherein FIG. 11A depicts a top view of the heat exchanger 1100 and FIG. 11B depicts a side view of the heat exchanger 1100. The heat exchanger 1100 comprises a bulk semiconductor element 1102. The heat exchanger further comprises a first channel 1104 and a second channel 1106 that are each disposed within the bulk semiconductor element 1102. The first channel 1104 has an inlet 1108 and an outlet 1110 that each terminate on a same top surface 1112 of the heat exchanger 1100. The second channel 1106 has an inlet 1114 and an outlet 1116 that each terminate on a same bottom surface 1118 of the heat exchanger 1100. The first channel 1104 comprises a first plurality of branches, e.g., the branch 1120, and the second channel 1108 comprises a second plurality of branches, e.g., the branch 1122. The first plurality of branches and the second plurality of branches intertwine to facilitate heat exchange between a first fluid that flows within the first channel 1104 and a second fluid that flows within the second channel 1106.

In a non-limiting example, and referring now to FIGS. 9A-B and 11A-B, the heat exchanger device 1100 can be connected to the device 900 by way of the inlet 1108 and outlet 1110 of the first channel 1104, which can be respectively connected to the outlet 910 and the inlet 908 of the channel 902 of the semiconductor device 900. The heat exchanger device 1100 can further be connected to a coolant reservoir (not shown) by way of the inlet 1114 and outlet 1116 of the second channel 1106. In the example, a first fluid that flows through the first channel 1104 of the heat exchanger device 1100 flows through the channel 902 of the semiconductor device 900. The first fluid conducts heat away from the top surface 906 of the device 900 as it flows through the channel 902. As the first fluid flows through the first channel 1104, heat is transferred from the first fluid to a second fluid that flows through the second channel 1106. The second fluid flows from the coolant reservoir and through the second channel 1106 back to the coolant reservoir.

Figure 12A:
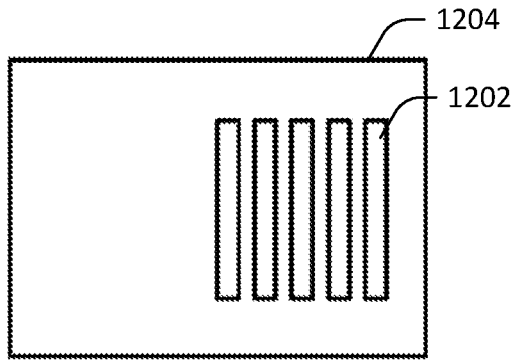
FIG. 12A is a cross-sectional view of an exemplary fluidic channel structure.
Figure 12B:
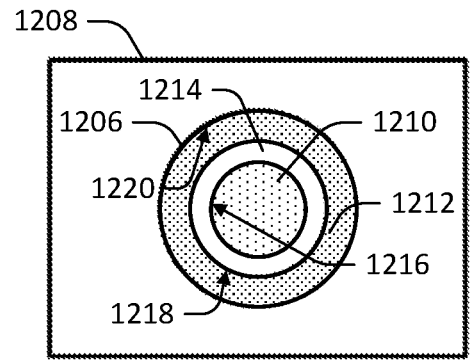
FIG. 12B is a cross-sectional view of another exemplary fluidic channel structure.

Referring now to FIGS. 12A and 12B, exemplary cross-sectional channel geometries are illustrated. With reference now solely to FIG. 12A, a channel 1202 that has a thin rectangular cross-section is disposed within a semiconductor element 1204. With reference now solely to FIG. 12B, another exemplary channel 1206 is shown disposed within a semiconductor element 1208, wherein the channel 1206 comprises two distinct cavities 1210, 1212. The first cavity 1210 is positioned at the center of the channel 1206 and is surrounded by a wall 1214 of semiconductor material. The wall 1214 of semiconductor material defines an interior surface 1216 of the cavity 1210. The cavity 1212 is positioned between the wall 1214 of semiconductor material and the remainder of the material of the semiconductor element 1208. The cavity 1212 has an annular cross-section such that the wall 1214 of semiconductor material defines an inner surface 1218 of the cavity 1212 and the remainder of the semiconductor element 1208 forms an outer surface 1220 of the cavity 1212. The channel 1206 is configured such that a first fluid can flow through the inner cavity 1210 and a second fluid can flow through the outer cavity 1212 without the fluids mixing.

With reference now to FIGS. 13A-13D, a heat exchange device 1300 that incorporates an expansion nozzle is illustrated. The heat exchange device 1300 comprises a bulk semiconductor element 1302 that has a channel 1304 formed therein. The channel 1304 has an inlet 1306 and an outlet 1308 that each terminate at a surface 1310 of the semiconductor element 1302. The channel 1304 includes an expansion nozzle 1312. The expansion nozzle 1312 comprises a constricted region of the channel 1304 wherein a diameter of the channel 1304 is smaller in the constricted region than on either side of the constricted region. FIGS. 13B-13D depict cross-sectional views of the channel 1304 cut along lines A-A, B-B, and C-C, respectively, that are shown in FIG. 13A. FIG. 13A depicts the channel 1304 at an inlet side of the expansion nozzle 1312. FIG. 13B depicts the channel 1304 in the constricted region of the expansion nozzle 1312, wherein the channel 1304 has a smaller diameter in the constricted region than at the inlet side of the expansion nozzle 1312. FIG. 13C depicts the channel 1304 at an outlet side of the expansion nozzle 1312, wherein the channel 1304 has a greater diameter at the outlet side of the expansion nozzle 1312 than in the constricted region. The channel 1304 is configured such that at the inlet side of the expansion nozzle 1312 a higher pressure is maintained than at the outlet side of the expansion nozzle 1312. When a fluid passes through the expansion nozzle 1312, the fluid undergoes a phase change from a liquid phase to a gaseous phase. As a result of the phase change, the fluid absorbs a substantial amount of heat. The expansion nozzle 1312 can therefore facilitate heat transfer into the fluid from a surface 1314 of the semiconductor element 1302 that is proximal to the expansion nozzle 1312.

Figure 14:
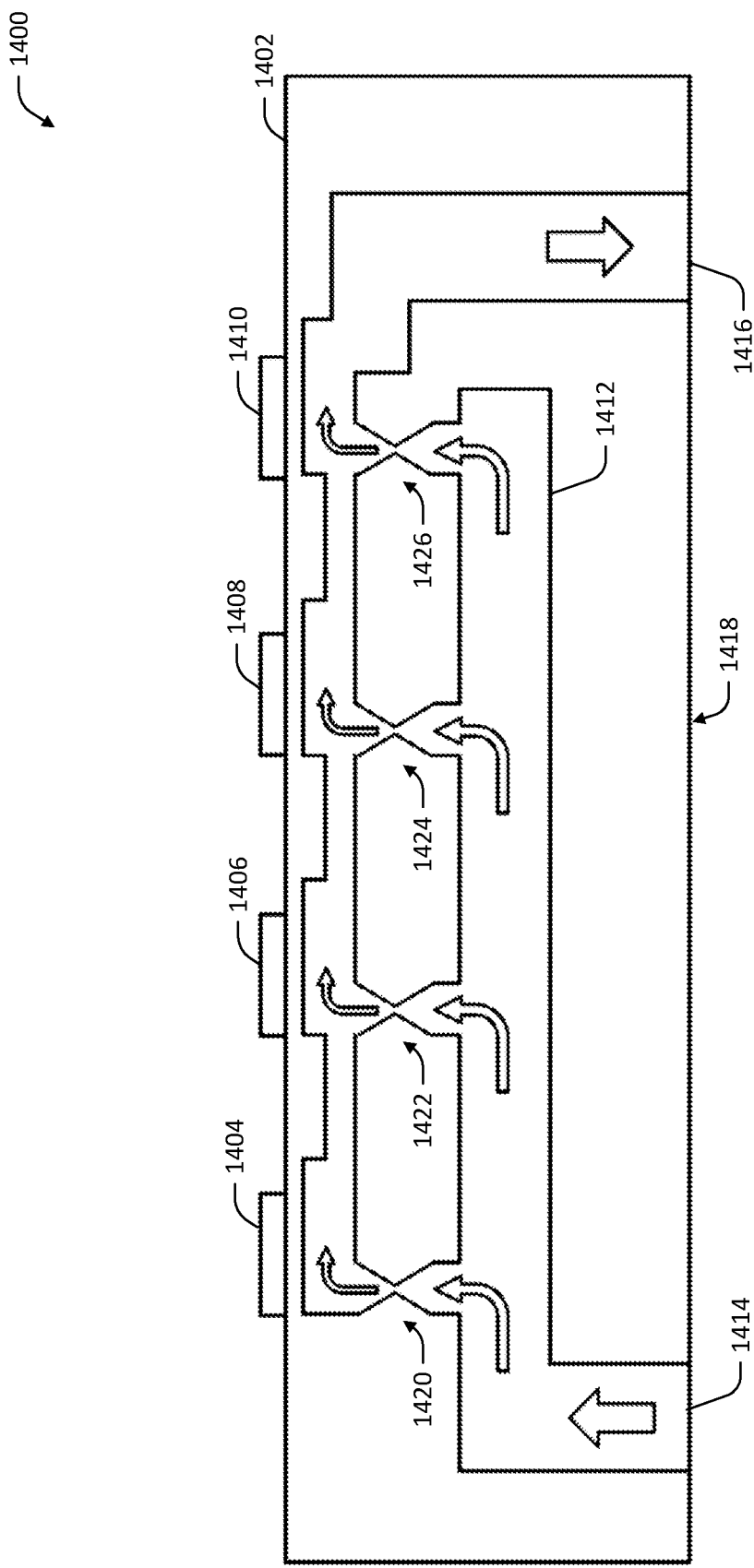
FIG. 14 is an exemplary cooling device that incorporates a plurality of expansion nozzles.

In various embodiments, a semiconductor device can incorporate an expansion nozzle to provide directed cooling of one or more components of an integrated circuit. By way of example, and referring now to FIG. 14, a semiconductor device 1400 that facilitates directed cooling of integrated circuit components by way of a plurality of expansion nozzles is illustrated. The semiconductor device 1400 comprises a bulk semiconductor element 1402 on which are deposited a plurality of components 1404-1410 of an integrated circuit. In non-limiting examples, the components 1404-1410 can be transistors, diodes, physical qubits, etc. The device 1400 further comprises a channel 1412 that is disposed within the semiconductor element 1402. The channel 1412 has an inlet 1414 and an outlet 1416 that each terminate on a bottom surface 1418 of the semiconductor element 1402. The inlet 1414 is in fluid communication with a plurality of expansion nozzles 1420-1426 that are formed in the channel 1412. Each of the expansion nozzles 1420-1426 is positioned with its outlet side directly below a respective component in the components 1404-1410. When a fluid in the channel 1412 undergoes a phase change from a liquid phase to a gaseous phase after passing through the expansion nozzles 1420-1426, the resulting heat absorption of the gaseous phase of the fluid provides effective localized cooling of the components 1404-1410.

The semiconductor used for the bulk semiconductor elements 904, 1004, 1102, 1302, 1402 in the heat exchange devices 900, 1000, 1100, 1300, 1400 can be selected for thermal conductivity and mechanical strength to facilitate heat exchange and to permit pressurization of fluids within various channels in the semiconductor elements 904, 1004, 1102, 1302, 1402. In exemplary embodiments, the semiconductor elements 904, 1004, 1102, 1302, 1402 are composed of silicon carbide (e.g., monocrystalline silicon carbide or polycrystalline silicon carbide) or silicon. Furthermore, the semiconductor elements 904, 1004, 1102, 1302, and 1402 can be comprised of solid, single-crystal semiconductor material with no bond interfaces that would impede heat transfer and limit the strength of the material. The channels of the heat exchanging devices can be coated with a film to eliminate chemical reactions, corrosion, or oxidation of the semiconductor material due to the fluid in the channel or the temperature at which the heat exchange is occurring.

Figure 15A:
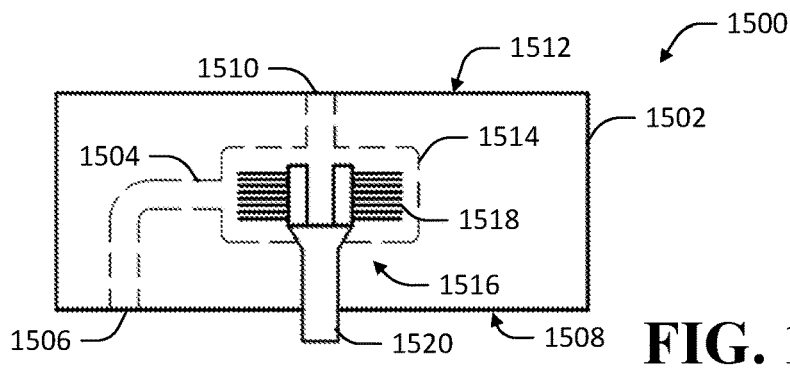
FIG. 15A is a side cutaway view of an exemplary pump device.
Figure 15B:
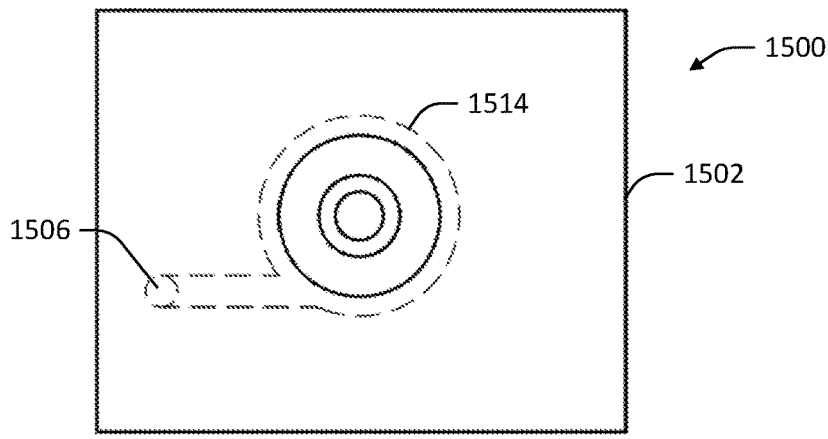
FIG. 15B is a top view of the exemplary pump device of FIG. 15A.
Figure 16A:
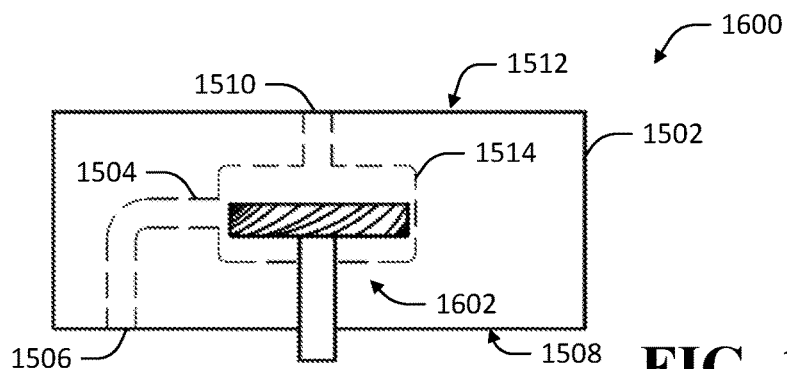
FIG. 16A is a side cutaway view of another exemplary pump device.
Figure 16B:
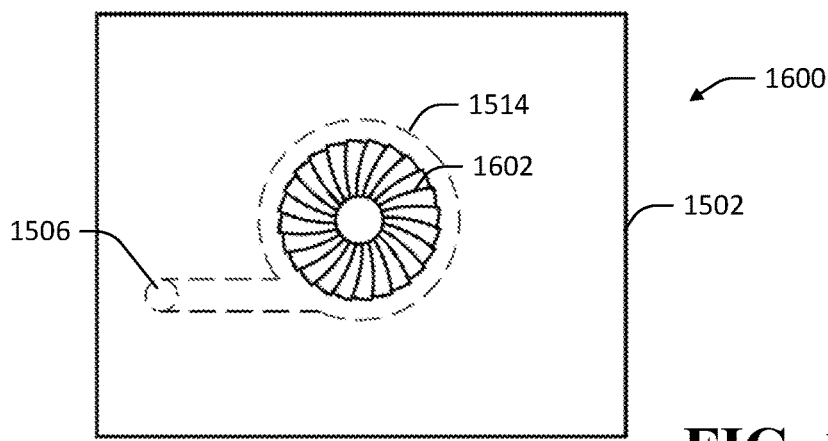
FIG. 16B is a top view of the exemplary pump device of FIG. 16A.

Referring now to FIGS. 15A and 15B, an exemplary pump device 1500 is illustrated. FIG. 15A depicts a cross-sectional side view of the exemplary pump device 1500. FIG. 15B depicts a top view of the exemplary pump device 1500. The pump device 1500 includes a bulk semiconductor element 1502 and a channel 1504 that is formed within the bulk semiconductor element 1502. The channel 1504 comprises an outlet 1506 that terminates on a bottom surface 1508 of the bulk semiconductor element 1502 and an inlet 1510 that terminates on a top surface 1512 of the bulk semiconductor element 1502. The channel 1504 further comprises a cavity 1514, and the pump device 1500 comprises a turbine 1516 that is positioned inside the cavity 1514. The turbine 1516 is depicted in FIGS. 15A and 15B as being a boundary layer turbine, or Tesla turbine. The boundary-layer turbine 1516 comprises a plurality of substantially parallel flat plates 1518 that are connected to a shaft 1520. When the shaft 1520 is turned, rotation of the plates 1518 draws fluid from the inlet 1510, into the cavity 1514, and out of the outlet 1506. In addition, the pump device 1500 can be run in reverse by using pressurized fluid to drive the shaft 1520 and perform mechanical work. With reference to FIGS. 16A and 16B, another exemplary pump device 1600 is shown, the pump device 1600 comprising the bulk semiconductor element 1502 and wherein the boundary-layer turbine 1516 is replaced by a bladed turbine 1602.

It is to be understood that in addition to the bulk semiconductor element 1502 being formed by way of selective electrochemical semiconductor etching, the turbines 1516 and 1602 can also be formed in part by way of selective electrochemical semiconductor etching. By way of example, the bulk semiconductor element 1502 can be selectively etched in order to form either of the turbine structures 1516, 1602 from the semiconductor material making up the bulk semiconductor element 1502. The semiconductor form of the turbine structure can then be cladded with a desired material (e.g., a metal, glass, or ceramic) by way of any of various deposition methods.

Figure 17:
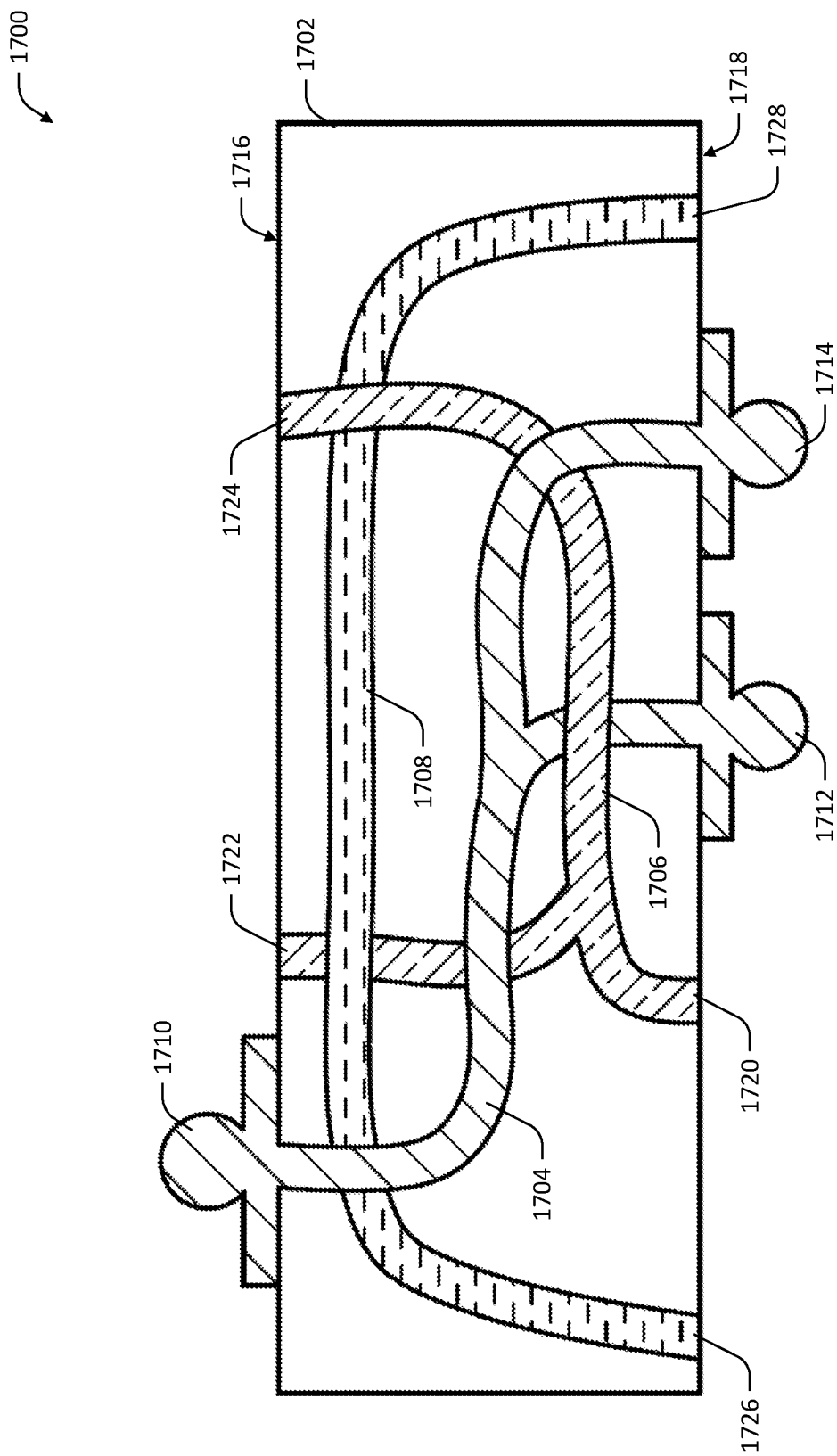
FIG. 17 is a diagram of an exemplary 3D interposer chip.

Referring now to FIG. 17, a 3D interposer device 1700 is shown, wherein the 3D interposer 1700 comprises a bulk semiconductor element 1702 in which a 3D via 1704, a 3D waveguide 1706, and a 3D fluid channel 1708 are formed. The via 1704 comprises a first end 1710, a second end 1712, and a third end 1714. The first end 1710 of the via 1704 terminates on a top surface 1716 of the bulk semiconductor element 1702. The second end 1712 and the third end 1714 terminate on a bottom surface 1718 of the bulk semiconductor element 1702. The ends 1710-1714 of the via 1704 are laterally offset from one another. The waveguide 1706 comprises a first end 1720, a second end 1722 and a third end 1724. The first end 1720 terminates on the bottom surface 1718 of the semiconductor element 1702, while the second end 1722 and the third end 1724 terminate on the top surface 1716 of the semiconductor element 1702. The ends 1720-1724 are laterally offset from one another at their locations of termination on the surfaces 1716, 1718. The fluid channel 1708 comprises a first end 1726 and a second end 1728 that both terminate on the bottom surface 1718 of the semiconductor element 1702 such that the first end 1726 and the second end 1728 are laterally offset. The via 1704, the waveguide 1706, and the fluid channel 1708 are variously intertwined such that they have varying depths into the page along their lengths. By way of example, the second end 1712 of the via 1704 is depicted in FIG. 17 as being farther into the page than the third end 1714 of the via 1704, with the third end 1724 of the waveguide 1706 being between the second end 1712 and third end 1714 of the via 1704. The 3D interposer device 1700 can be used to form electrical, optical, or fluidic connections between devices, such as integrated circuits, that are connected to the top side 1716 and the bottom side 1718 of the 3D interposer.

Figure 18:
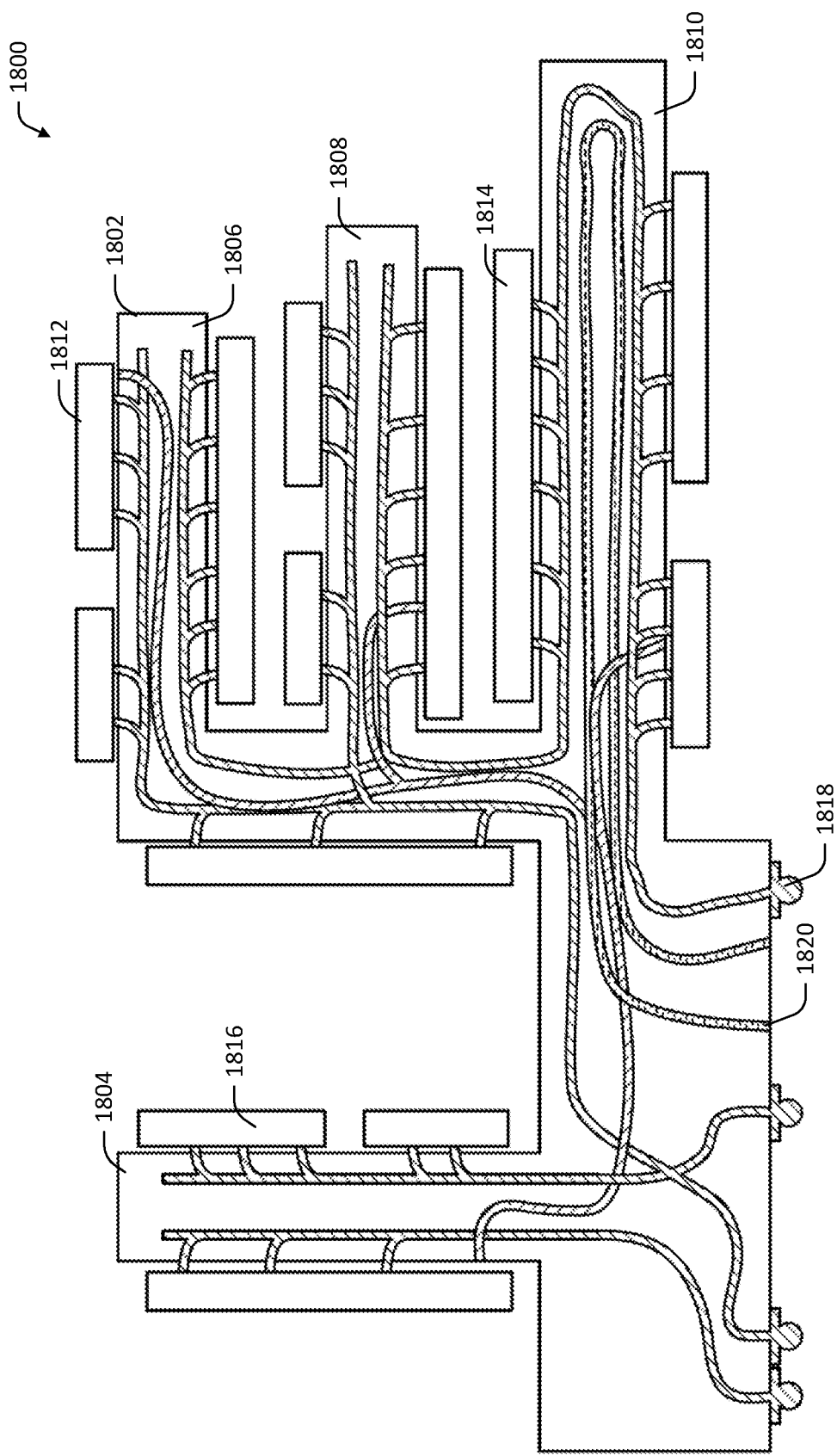
FIG. 18 is a diagram of another exemplary 3D interposer.

With reference now to FIG. 18, another exemplary 3D interposer 1800 is illustrated. The 3D interposer 1800 comprises a bulk semiconductor element 1802. The semiconductor element 1802 of the 3D interposer 1800 is not planar, but rather has various protrusions 1804-1810. The 3D interposer 1800 is configured to make various electrical, optical, and fluidic connections among a plurality of devices that are connected to the interposer 1800 (e.g., chips 1812, 1814, 1816). By way of example, the 3D interposer 1800 includes a plurality of vias, waveguides, and fluidic channels (e.g., via 1818 and fluid channel 1820) that are disposed within the bulk semiconductor element 1802 and that terminate on one or more surfaces of the semiconductor element 1802. In accordance with embodiments described herein, a 3D interposer can be constructed to have substantially any desirable geometry to accommodate a desired arrangement of devices that are to be connected to the 3D interposer.

Figure 19:
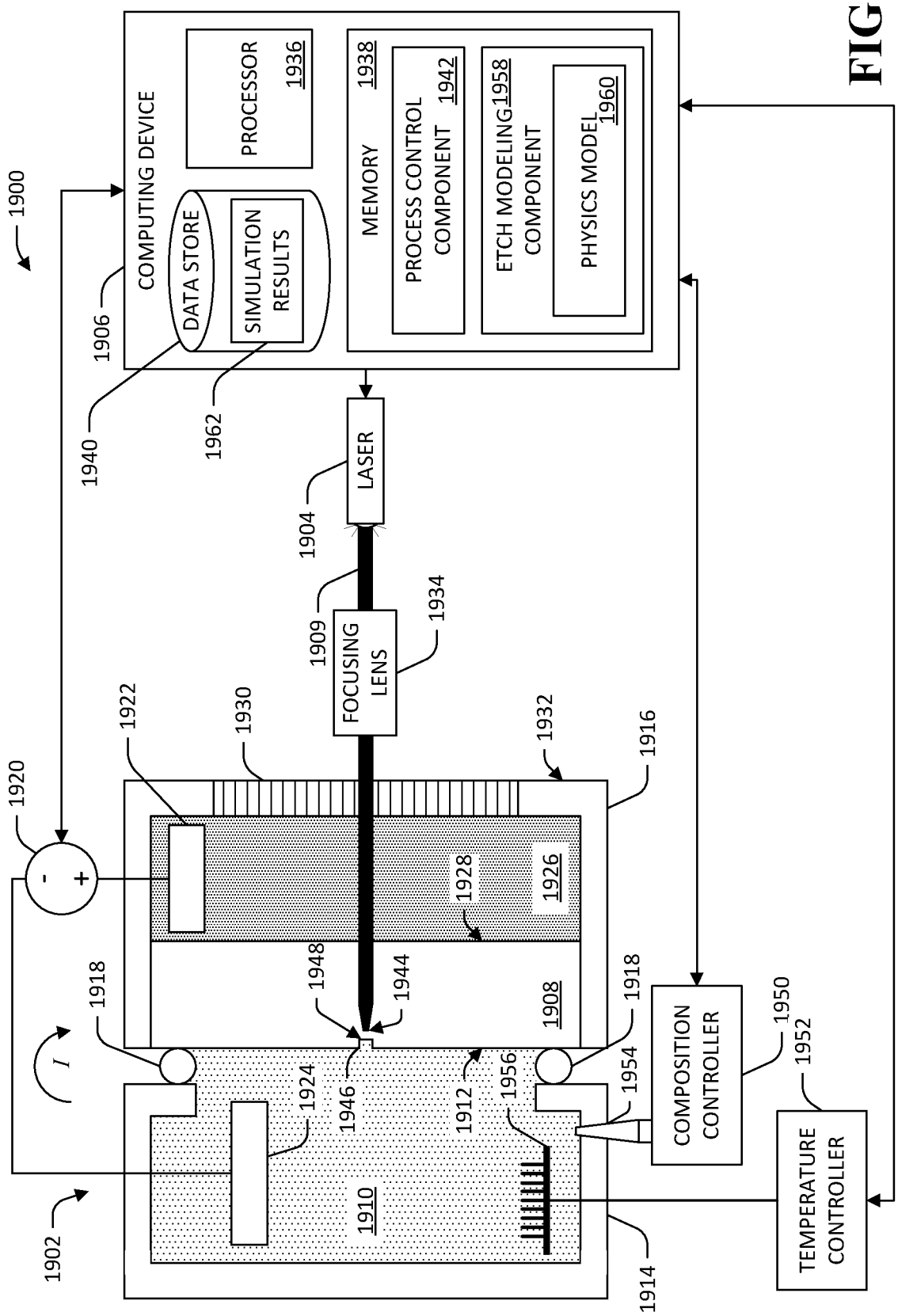
FIG. 19 is a diagram of an exemplary system that facilitates selective etching of a semiconductor controlled by way of a sub-bandgap-energy laser.

Various technologies pertaining to selective electrochemical etching of a semiconductor are now described. With reference to FIG. 19, an exemplary system 1900 that facilitates selectively controlled semiconductor etching is illustrated. The system 1900 includes an etching chamber 1902, a laser 1904, and a computing device 1906 that controls the laser 1904. The etching chamber 1902 contains a semiconductor element 1908 that is desirably etched and an etching solution 1910 that selectively oxidizes and etches the semiconductor 1908 at locations where holes exist in the atomic lattice of the semiconductor 1908. The laser 1904 emits a beam of light 1909 at the semiconductor 1908 based on control signals received from the computing device 1906 in order to create holes at particular regions in the semiconductor 1908. The semiconductor 1908 is then etched by the etching solution 1910 at locations where the created holes migrate to a first surface 1912 of the semiconductor 1908 that is exposed to the etching solution 1910. Hence, the laser 1904 is controlled to cause the semiconductor 1908 to be etched at desired locations based upon where the laser 1904 creates holes in the semiconductor 1908.

Composition of the etching solution 1910 is selected based upon a chemical makeup of the semiconductor 1908. By way of example, and not limitation, in applications where the semiconductor 1908 comprises silicon or other carbon group elements (e.g., silicon, carbon, germanium, etc.), the etching solution 1910 can comprise hydrofluoric acid (HF). For example, the etching solution 1910 can be a solution of between 1% and 30% HF. In other embodiments, other chemicals that provide fluorine atoms for the reaction can also be used, such as ammonium hydroxide/ammonium fluoride. In various embodiments, the etching solution 1910 can include surfactants (e.g., ethanol, Dimethylformamide, acetonitrile, etc.) that enhance wetting of the etching solution 1910 to the surface 1912 of the semiconductor 1908 and can facilitate removal of etch gases from the surface 1912 of the semiconductor 1908. It is to be understood that methods and systems described herein are suitable for selective etching of a variety of semiconductors. In some exemplary embodiments, the semiconductor 1908 comprises an intrinsic elemental semiconductor such as silicon, carbon (diamond, graphene, carbon nanotubes, etc.), germanium, etc. In other exemplary embodiments, the semiconductor 1908 comprises a group III-V semiconductor (e.g., gallium arsenide, indium phosphide, etc.), a group III-nitride (e.g., gallium nitride, indium gallium nitride, etc.), a group II-VI semiconductor (e.g., zinc oxide, cadmium telluride, etc.) or other semiconductor compounds (e.g., silicon carbide, silicon germanium, etc.). A composition of the etching solution 1910 can be selected to facilitate etching of the desirably etched semiconductor. In connection with manufacturing various of the devices described herein, the desirably etched semiconductor may be selected based on desired electrical, optical, or thermal behavior of the semiconductor in the device. By way of example, silicon carbide may be selected as a suitable semiconductor for fabricating heat exchange devices since silicon carbide has a high thermal conductivity relative to other semiconductors such as pure silicon. In another example, in the capacitors 200, 300 described above, the semiconductor material that makes up the bulk semiconductor elements 202, 302 can be selected to have a desired dielectric constant.

Various details pertaining to configuration and operation of the system 1900 in connection with selectively etching the semiconductor element 1908 are now described. The etching chamber 1902 comprises a first containment vessel 1914 and a second containment vessel 1916. The first containment vessel 1914 contains the etching solution 1910. The vessels 1914, 1916 are joined by a seal 1918 (e.g., an O-ring, where the vessels 1914, 1916 are annular) that prevents escape of the etching solution 1910 from the etching chamber 1902. The semiconductor 1908 is positioned in the second containment vessel 1916 such that the first surface 1912 of the semiconductor 1908 is exposed to the etching solution 1910.

The system 1900 further comprises a voltage source 1920 that establishes an electric field in the semiconductor that facilitates the etching reaction at the surface 1912 of the semiconductor 1908. The voltage source 1920 is connected to an anode electrode 1922 and a cathode electrode 1924 at positive and negative terminals of the voltage source 1920, respectively. The anode electrode 1922 is positioned within the second containment vessel 1916 in contact with a conductive material 1926. The conductive material 1926 is placed in contact with a second surface 1928 of the semiconductor 1908 that is opposite the surface 1912 that is exposed to the etching solution 1910. When a voltage is applied to the electrodes 1922, 1924 by the voltage source 1920, an electric field is established within the semiconductor 1908 that can be used to direct charge-carriers to desired locations within the semiconductor 1908. For instance, the voltage source 1920 can be controlled to establish an electric field within the semiconductor 1908 that tends to cause positive charge-carriers, such as holes, to migrate toward the etching surface 1912.

The second containment vessel 1916 further comprises a window 1930 positioned at an outer surface 1932 of the vessel 1916 and extending through the surface 1932 to face the backside surface 1928 of the semiconductor 1908 (i.e., the surface opposite the surface being etched). The window 1930 is transparent to the beam 1909 emitted by the laser 1904. The laser 1904 is positioned facing the window 1930 and emits the beam 1909 through the window 1930 toward the backside 1928 of the semiconductor 1908. The conductive material 1926 is selected or configured to be transparent to the beam of light 1909 emitted by the laser 1904. By way of example, and not limitation, the conductive material 1926 can be salt water, an acid, a base, a transparent conductive oxide, a very thin metal film (e.g., 10-50 nm), a metal mesh, graphene, carbon nanotubes, a transparent conductive polymer, etc. In another exemplary embodiment, the conductive material 1926 can be a weak HF solution. Where the etching solution 1910 comprises HF, use of a HF solution as the conductive material 1926 can inhibit undesired reactions between the etching solution 1910 and the conductive material 1926 should they come into contact. The system 1900 can further include a focusing lens 1934 (e.g., an objective lens, or a custom optical focusing element) that receives the beam 1909 from the laser 1904 and focuses the beam 1909 through the window 1930 to a focal spot within the semiconductor element 1908. The beam 1909 would be a focal cone after exiting the focusing lens 1934, however, for simplification and illustrative purposes the beam 1909 (and in some subsequent figures) is shown as a straight beam until it reaches its focal position 1944.

The computing device 1906 comprises a processor 1936, memory 1938 that is operably coupled to the processor 1936, and a datastore 1940 operably coupled to the processor 1936. The memory 1938 includes instructions that, when executed by the processor 1936 cause the processor 1936 to perform various functions. a process control component 1942 that controls various aspects of a process for selectively etching the semiconductor 1908. For example, the process control component 1942 controls orientation and positioning of the laser 1904 and/or the focusing lens 1934 in connection with illuminating particular locations in the semiconductor 1908. The process control component 1942 can also be configured to control other etch input variables such as intensity of the beam 1909, the bias voltage applied by the voltage source 1920, temperature of the etching solution 1910, etc.

Operations of the system 1900 in connection with selectively etching the semiconductor 1908 are now described. Etching of the semiconductor 1908 by the etching solution 1910 occurs based upon a series of chemical reactions that are carried out at the etching surface 1912 of the semiconductor 1908 in the presence of holes in the atomic lattice at the surface 1912. For example, in an exemplary embodiment wherein the semiconductor 1908 comprises silicon and the etching solution 1910 comprises hydrofluoric acid, the etching reaction is the following two-step electrochemical reaction:

$$Si + 2F^- + 2h^+ \rightarrow SiF_2 \quad (1)$$

$$SiF_2 + 2HF \rightarrow SiF_4 + H_2 \quad (2)$$

In the chemical reaction shown in Equation 1, positively charge holes at the surface of a silicon semiconductor facilitate a reaction between negatively charged fluorine ions and neutral silicon to yield $SiF_2$ at the surface. The chemical reaction of Equation 2 is the etching reaction, whereby the HF etching solution reacts with the $SiF_2$ to yield $SiF_4$ and $H_2$ gases. The electrochemical etching reaction described by Equations 1 and 2, therefore, can be controlled by controlling a quantity and location of holes in the semiconductor. Where holes are present, etching can occur, and where holes are absent etching does not occur. Other alternative chemical reaction equations have been proposed for silicon electrochemical etching of silicon with an intermediate silicon oxide step. In general, various proposed reaction equations and experimental results demonstrate a need for holes for the etch to occur.

In the exemplary system 1900, holes are created by illumination of the semiconductor 1908 by the laser 1904. Since an electrochemical etching reaction of the etching solution 1910 with the semiconductor 1908 is facilitated by the presence of holes, etching of the semiconductor 1908 can be controlled based upon illumination of the semiconductor 1908 by the laser 1904. In order to create a hole in a semiconductor, sufficient energy must be imparted to an electron in the lattice of the semiconductor to allow the electron to bridge the bandgap of the semiconductor from the valence band to the conduction band. Conventionally, therefore, holes have been created in semiconductors using a laser wherein each photon has an energy greater than the bandgap energy of the semiconductor.

By contrast, the laser 1904 is a laser that emits light wherein the photon energy is less than the bandgap energy of the semiconductor 1908. Sub-bandgap-energy light is ordinarily not absorbed by the semiconductor 1908, and thus the semiconductor 1908 is typically transparent to the beam 1909 emitted by the laser 1904. The focusing lens 1934 is configured to focus the beam 1909 to an intense focal spot 1944 in the semiconductor 1908. Whereas ordinarily sub-bandgap-energy light does not impart sufficient energy to an electron to cause the electron to be freed from its location in the lattice of the semiconductor (thereby creating a hole), when the focusing lens 1934 focuses the beam to the intense focal spot 1944, MPA can occur whereby multiple photons impart energy to an electron substantially simultaneously. When an electron absorbs multiple photons each having an energy below the bandgap energy, sufficient energy can be imparted to cause the electron to move from the valence band to the conduction band, thereby creating a hole.

Figure 20:
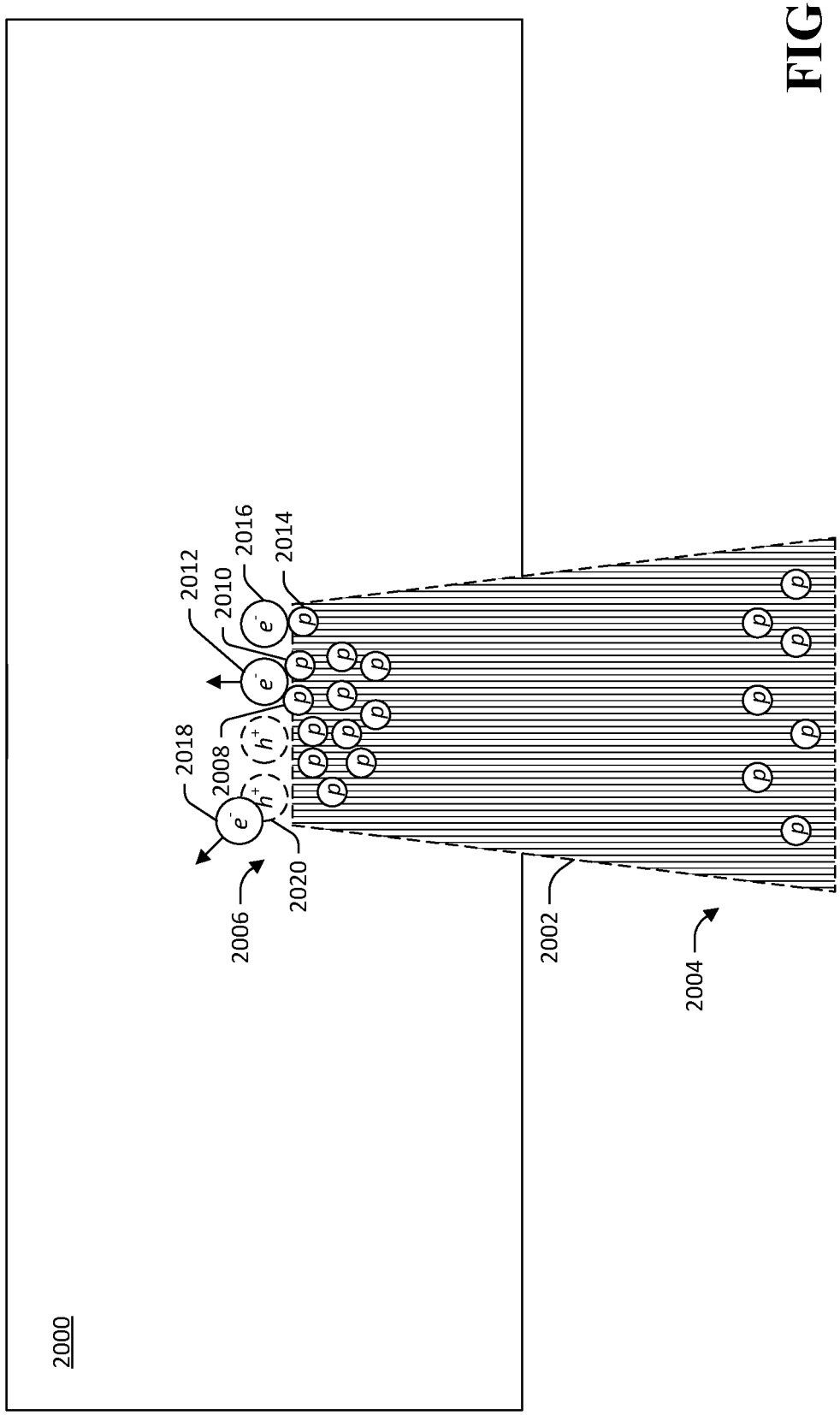
FIG. 20 is a conceptual diagram of MPA in a vicinity of a focal spot of a sub-bandgap-energy illumination source.

By way of illustration, and referring now to FIG. 20, a conceptual diagram of creation of holes in the atomic lattice of a semiconductor is shown. It is to be understood that while certain aspects pertaining to electrons, photons, and holes are depicted and described with respect to FIG. 20, such aspects are intended only as a conceptual illustration to facilitate understanding of an underlying physical process and are not intended as a fully accurate depiction of subatomic physical processes. FIG. 20 depicts a snapshot view of a semiconductor 2000 that includes a plurality of electrons $e^-$. The electrons $e^-$ are constrained to be either in the valence band of the semiconductor 2000 or the conduction band of the semiconductor 2000. FIG. 20 further depicts a beam 2002 of light, e.g., as emitted by a laser. As shown in FIG. 20, the beam 2002 includes a plurality of photons p, wherein each of the photons p has an energy below the bandgap energy of the semiconductor 2000.

Initially, the beam 2002 is unfocused in a region 2004. In the unfocused region 2004, the beam 2002 is unlikely to impart sufficient energy to an electron to cause the electron to cross the bandgap from the valence band to the conduction band, as it is unlikely that two or more photons will impart energy to an electron simultaneously. The beam 2002 comes into focus at a focal spot 2006 within the semiconductor 2000. At the focal spot 2006, fluence of the beam 2002 (i.e., energy per unit area) increases relative to the unfocused region 2004. Thus, at the focal spot 2006 it is more likely that two or more photons will impart energy to an electron at substantially the same time. MPA occurs at the focal spot 2006 of the beam 2002. For instance, as shown in FIG. 20, two photons 2008, 2010 arrive simultaneously at an electron 2012. The photons 2008, 2010 impart sufficient energy to cause the electron 2012 to move from its position in the atomic lattice of the semiconductor 2000, as indicated by the arrow extending from the electron 2012. By contrast, only a single photon 2014 arrives at another electron 2016 at the snapshot of time depicted in FIG. 20. Since the photons p of the beam 2002 have a sub-bandgap energy, the single photon 2014 is insufficient to impart enough energy to the electron 2016 to cause the electron 2016 to move from its position in the lattice and, therefore, photon 2014 is not absorbed and electron 2016 does not leave the valence band. When an electron $e^-$ leaves its position in the lattice of the semiconductor 2000 a positively-charged hole $h^+$ remains behind. For example, an electron 2018 is depicted as moving away from a position in the lattice while a hole 2020 remains in its place.

Referring again to FIG. 19, holes are created at the focal spot 1944 by MPA of the sub-bandgap-energy light of the beam 1909 by electrons in the atomic lattice of the semiconductor 1908 at the focal spot 1944. Holes created at the focal spot 1944 can migrate to the etching surface 1912, causing oxidation and subsequent etching of the semiconductor 1908 at locations of holes at the surface 1912. By way of example, the semiconductor 1908 comprises an etched feature 1946 that extends into the semiconductor 1908 from the surface 1912. As holes created at the focal spot 1944 migrate to a bottom surface 1948 of the etched feature 1946, the etching solution 1910 oxidizes and etches the bottom surface 1948 of the feature 1946 to further extend the feature 1946 into the body of the semiconductor 1908.

The process control component 1942 can control various parameters of the electrochemical etching of the semiconductor 1908 by the etching solution 1910 in the etching chamber 1902 to facilitate etching of desired features. In an example, an electrical field can be established and variably controlled to affect a size or shape of a feature etched in the semiconductor 1908. In the system 1900 the computing device 1906 is in communication with the voltage source 1920, and the process control system 1942 is configured to control an output of the voltage source 1920. The process control system 1942 can control the voltage source 1920 to establish an electric field in the semiconductor 1908. The electric field can be maintained such that holes are swept to the etching surface 1912, as referenced above. Establishment of the electric field in the semiconductor 1908 by way of the voltage source 1920 facilitates performance of selective etching of the surface 1912 of the semiconductor 1908 by directing holes to desired locations in the lattice of the semiconductor. Various internal electric fields (not due to the voltage source 1920) within the semiconductor 1908 exert forces on holes in the semiconductor 1908 that can cause semiconductor drift. Further, holes diffuse through the semiconductor 1908 from areas of higher concentration to areas of lower concentration. Establishing an electric field within the semiconductor 1908 using the voltage source 1920 can reduce an effect of other electric fields and carrier diffusion on an ultimate position of a hole at the surface 1912 of the semiconductor 1908 by reducing a time between generation of the hole at the focal spot 1944 of the laser 1904 and the hole reaching the surface 1912. In exemplary embodiments, a voltage of less than or equal to about 2 volts (e.g., less than 2 volts) supplied by the voltage source 1920 is found to be sufficient to enable feature sizes of less than 100 nanometers as may be desired in embodiments of the various devices described above. Higher voltages may alternatively be used in conjunction with electric field focusing to achieve features with sizes smaller than the optical resolution limit in the semiconductor material.

Figure 21:
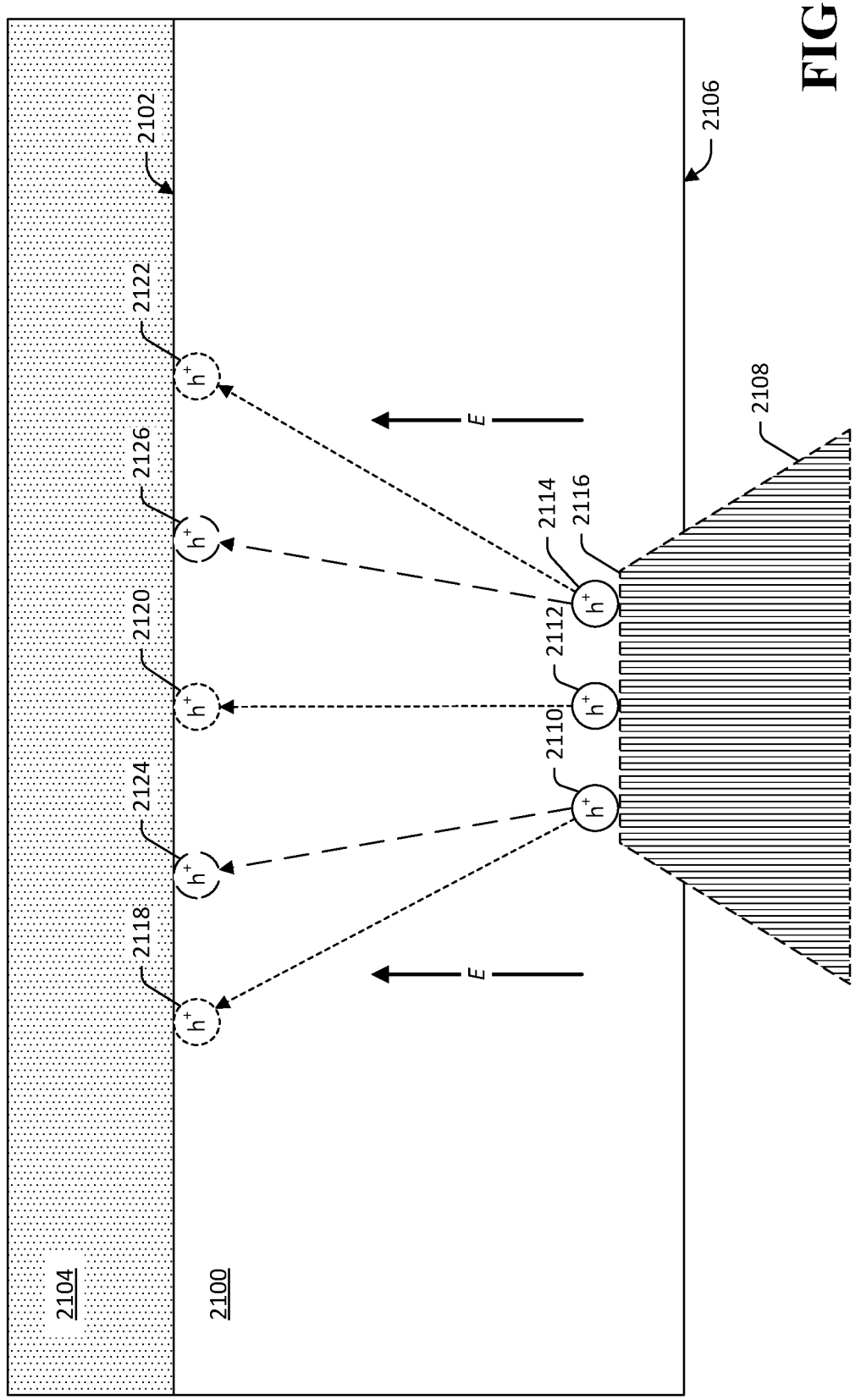
FIG. 21 is a conceptual diagram of hole drift under the influence of induced electric fields.

By way of example, and referring now to FIG. 21, a diagram depicting migration of holes under the influence of two different electric fields is illustrated. FIG. 21 depicts a semiconductor element 2100 that comprises a first surface 2102 that is exposed to an etching solution 2104 and a second surface 2106 opposite the first surface 2102, wherein a beam of sub-bandgap-energy light 2108 enters the semiconductor 2100 through the second surface 2106. The beam 2108 generates a plurality of holes 2110-2114 at a focal spot 2116 of the beam 2108 that is positioned within the semiconductor 2100. The holes 2110-2114 migrate toward the etching surface 2102 of the semiconductor 2100 under the influence of an electric field E. For a first intensity of the electric field E, the holes 2110-2114 migrate to respective positions 2118-2122. If the electric field E is increased to a second, greater intensity (e.g., by increasing a voltage output of the voltage source 1920 in the system 1900), the holes 2110-2114 may be swept to the etching surface 2102 more quickly. As shown in FIG. 21, under the influence of an electric field having the second, greater intensity, the holes 2110, 2114 migrate to respective positions 2124, 2126 that are closer together than the positions 2118, 2122. Therefore, a size (e.g., a diameter) of an etch feature for a given set of illumination parameters (e.g., size, position, intensity of the focal spot of the laser) can be increased by reducing the intensity of the electric field E or can be decreased by increasing the intensity of the electric field E.

Still other parameters of the system 1900 can be controlled by the process control component 1942 in connection with etching desired features in the semiconductor 1908. In an exemplary embodiment, the process control component 1942 outputs a control signal to the laser 1904 and/or the focusing lens 1934 that causes the laser 1904 and/or the focusing lens 1934 to adjust size, intensity, or positioning of the focal spot 1944 within the semiconductor 1908 to affect a resultant etch.

Figure 22:
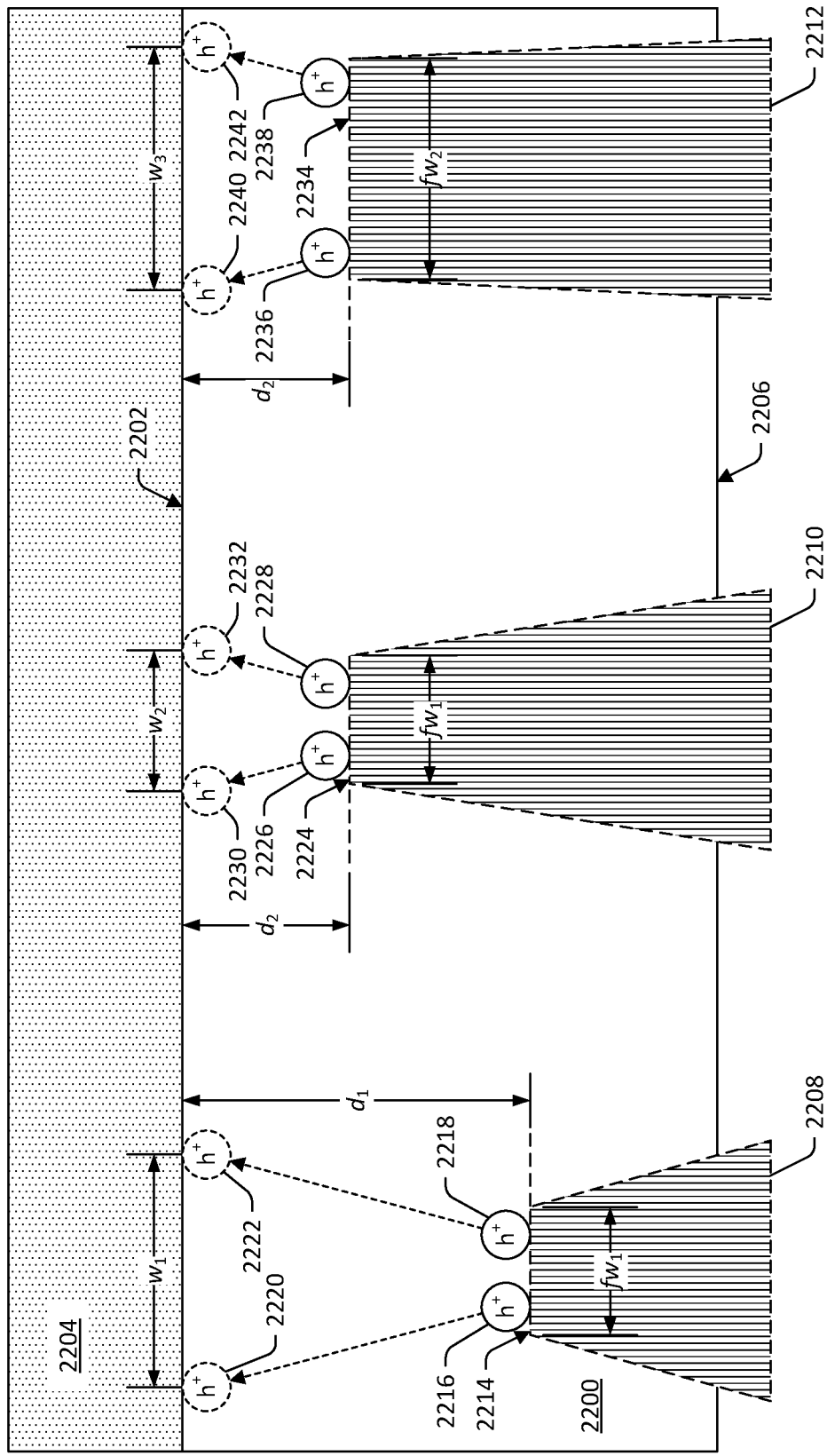
FIG. 22 is a conceptual diagram illustrating generation and migration of holes in a semiconductor.
Figure 23:
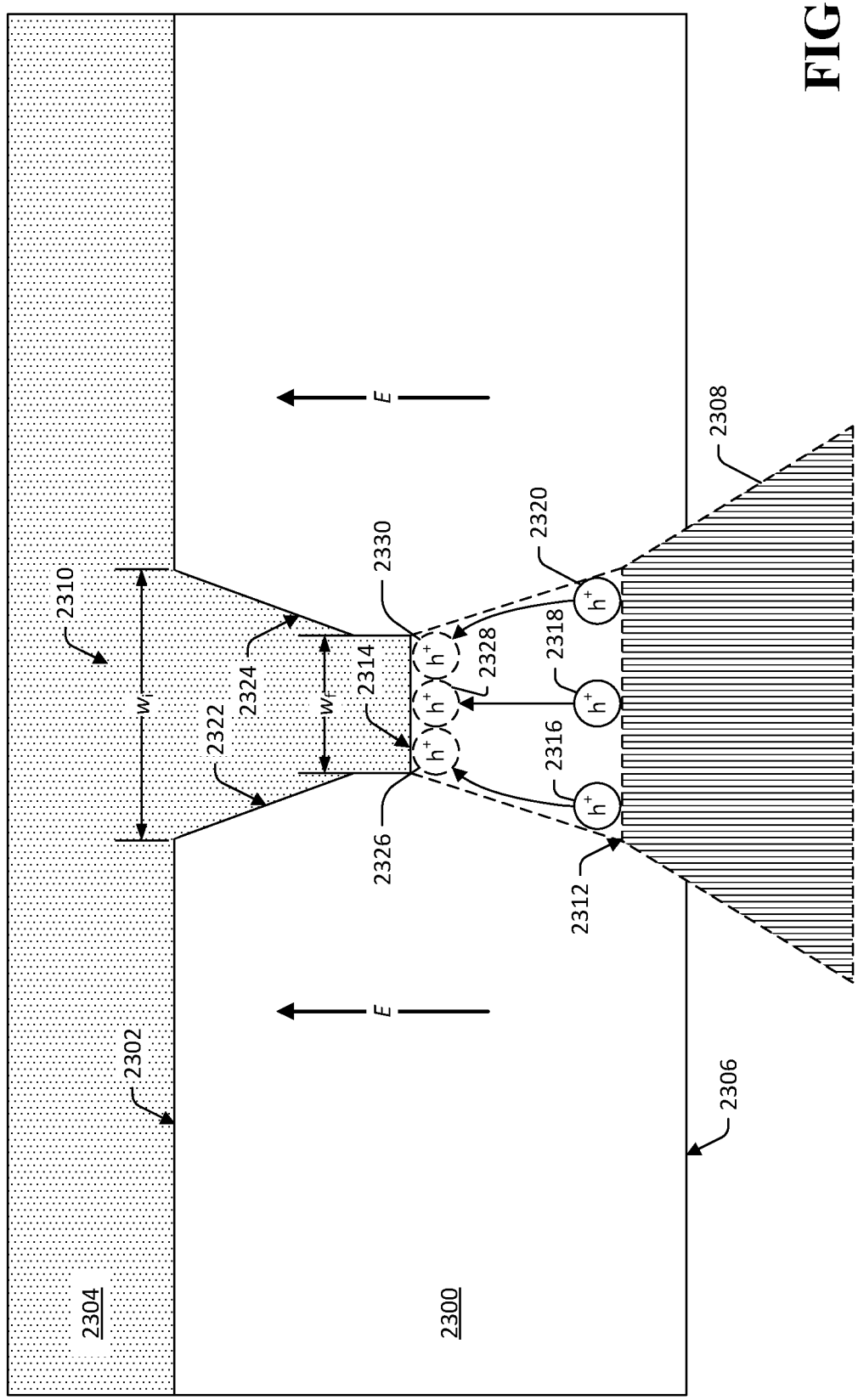
FIG. 23 is a conceptual diagram illustrating electric field focusing effects on migration of holes in a semiconductor.

By way of example, and referring now to FIG. 22 a diagram depicting differences in migration of holes within a semiconductor for various sizes and positions of a focal spot is illustrated. FIG. 22 depicts a semiconductor element 2200 that comprises a first surface 2202 that is exposed to an etching solution 2204 and a second backside surface 2206 opposite the first surface 2202, wherein beams 2208-2212 of sub-bandgap-energy light are depicted as entering the semiconductor 2200 through the backside surface 2206. Each of the beams 2208-2212 has a different combination of focal spot size and position relative to the etch surface 2202. The beam 2208 has a focal spot 2214 with a focal spot width $fw_1$ positioned at a depth of $d_1$ away from the etching surface 2202. Holes 2216, 2218 are depicted as being initially spaced a maximal distance of $fw_1$ apart at the focal spot 2214. Due to carrier diffusion, internal or induced electric fields, or other various forces, the holes 2216, 2218 migrate to positions 2220, 2222 at the etch surface 2202 of the semiconductor 2200. The positions 2220, 2222 are positioned a width $w_1$ apart, where a value of $w_1$ depends on various etch parameters described herein. Similarly, the beam 2210 has a focal spot 2224. The focal spot 2224 of the beam 2210 has the same focal spot width $fw_1$ as the focal spot 2214 of the first beam 2208, but the focal spot 2224 is positioned at a shallower depth $d_2$ than the depth $d_1$ of the first focal spot 2214. As a result, all else being equal, holes 2226, 2228 generated at a maximal distance of $fw_1$ apart at the focal spot 2224 migrate to respective second positions 2230, 2232 at the etching surface 2220 that are spaced a smaller width $w_2$ apart than the width $w_1$. For a same-size focal spot, a size of an etch feature at the etch surface of the semiconductor can be increased by increasing a distance between the focal spot and the etch surface.

A width of the focal spot can also affect a width of a resultant etch feature. Still referring to FIG. 22, the third beam 2212 has a focal spot 2234 positioned at the same depth $d_2$ as the focal spot 2224 of the second beam 2210. The focal spot 2234 of the third beam 2212 further has a focal spot width $fw_2$ that is greater than the focal spot width $fw_1$ of the second beam 2210. Holes 2236, 2238 are depicted as being generated at a maximal distance of $fw_2$ apart at the focal spot 2234. The holes 2236, 2238 are shown as migrating to respective second locations 2240, 2242 at the etch surface 2202, the locations 2240, 2242 spaced a width $w_3$ apart. The width $w_3$ is greater than the width $w_2$ indicating that, all else being equal, the greater focal spot width $fw_2$ yields a greater etch feature width $w_3$.

A position of the focal spot 1944 of the laser 1904 can further be controlled relative to positions of existing etched features in the semiconductor 1908 to affect a resultant size or shape of an etched feature. For example, the focal spot 1944 can be positioned in close proximity to a surface of an etched feature in the semiconductor 1908 (e.g., within 10 nanometers of the surface of the feature to within 10 to 200-microns of the surface of the feature or more depending on the carrier diffusion length of the specific semiconductor), such that internal electric fields established by the geometry of the etched feature alter motion of holes created at the focal spot 1944. In a non-limiting example, and referring now to FIG. 23, a diagram of an exemplary etch of a semiconductor 2300 is shown, wherein holes are generated in close proximity to an existing etch feature to reduce a size of the etching. The semiconductor comprises a frontside surface 2302 that is exposed to an etching solution 2304 and a backside surface 2306 through which a beam of sub-bandgap-energy light 2308 enters the semiconductor 2300. The semiconductor 2300 includes a feature 2310 etched in the surface 2302 of the semiconductor 2300. The feature 2310 has an initial width $w_i$ at the surface 2302. In an exemplary embodiment, the initial width $w_i$ is based on a width of a focal spot 2312 of the beam 2308, an intensity of an induced electric field E in the semiconductor 2300, a relative difference in concentration of charge carriers between the surface 2302 and the location of focal spot 2312, etc. As the feature 2310 extends into the semiconductor 2300, the width of the feature 2310 tapers to a smaller final width $w_f$, due to electric field focusing of charge-carriers at a tip 2314 of the feature 2310.

By way of illustration, a plurality of holes 2316-2320 are generated at the focal spot 2312 of the beam 2308. Under the influence of the induced electric field E, the holes 2316-2320 migrate from the focal spot 2312 of the beam 2308 toward the etching surface 2302 of the semiconductor 2300. In the absence of an existing feature, a smallest width of an etch feature at the surface 2302 may be limited by a focal spot size of the beam 2308. For example, in connection with initially etching the feature 2310 at the surface 2302 of the semiconductor 2300, the initial width $w_i$ may be the width of the focal spot 2312. As the feature 2310 is etched into the semiconductor, surfaces of the feature 2310 (e.g., interior surfaces 2322, 2324) cause the electric field lines (not pictured) to be bent from surface 2306 towards the feature 2310, and in particular towards the tip 2314 of the feature 2310. This change in the electric field due to feature 2310 exert forces on holes as they migrate through the semiconductor 2300. Accordingly, the holes 2316-2320 that are created at the focal spot 2312 of the beam 2308 are drawn toward the tip 2314 of the feature 2310 to positions 2326-2330 within the width $w_f$. Whereas absent the feature 2310 the holes 2316-2320 may spread apart as they migrate toward the surface 2302 (e.g., due to charge-carrier diffusion in the semiconductor 2300), surfaces of the feature 2310 draw the holes toward them In exemplary embodiments, the final width $w_f$ of the feature 2310 is less than the width of the focal spot 2312. Hence, and referring again to FIG. 19, by placing the focal spot 1944 of the laser 1904 near an etched feature in the semiconductor 1908, features can be etched in the semiconductor 1908 that have a smaller size than a resolution limit of the laser 1904 and focusing lens 1934. In one illustrative example, if the laser 1904 has a minimum focal spot size of 1000 nanometers, the process control component 1942 can control the laser 1904 to take advantage of electric field focusing to etch features having dimensions of as little as 10 nanometers.

Since sub-bandgap-energy light is not absorbed by the semiconductor 1908 except at the focal spot 1944 of the laser 1904, the focal spot 1944 can be positioned anywhere within the three-dimensional body of the semiconductor 1908. This enables etching of three-dimensional features within the semiconductor 1908 without requiring a direct straight-line path to the etching surface 1912 of the semiconductor 1908 as typically required in conventional etching based on photomasks.

Figure 24:
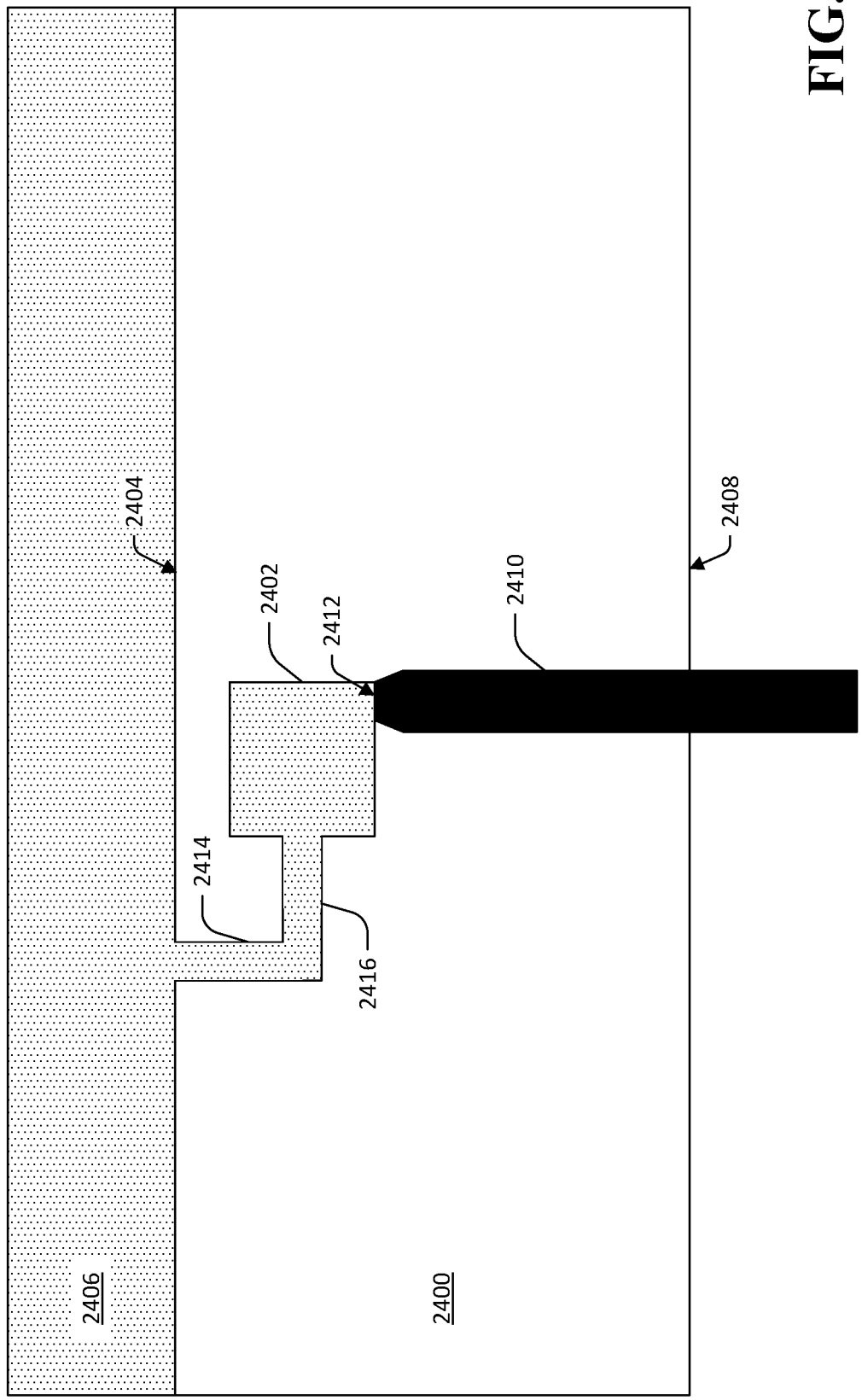
FIG. 24 is a diagram of an exemplary sub-surface semiconductor etch.

For example, and referring now to FIG. 24 an exemplary etching of a semiconductor 2400 is depicted wherein a cavity 2402 is formed within a body of the semiconductor 2400. As shown in FIG. 24, the semiconductor 2400 comprises a frontside surface 2404 that is exposed to an etching solution 2406 and a backside surface 2408 through which a beam 2410 of sub-bandgap-energy light enters the semiconductor 2400. The cavity 2402 is disposed within the bulk of the semiconductor 2400 rather than being formed on a surface of the semiconductor 2400. Since the semiconductor 2400 is transparent to the beam 2408 other than at a focal spot 2412 of the beam 2410, the focal spot 2412 can be positioned to generate holes anywhere within the body of the semiconductor 2400. In connection with etching the cavity 2402, additional channel features 2414, 2416 are etched prior to the etching of the cavity 2402. While a location of etching by the etching solution 2406 can be controlled by controlling generation of holes in the semiconductor 2400 using the beam 2408, in order for a feature to be etched the etching solution 2406 must be able to reach the feature. Hence, the first channel feature 2414 is etched from the frontside surface 2404 and into the bulk of the semiconductor 2400. The second channel feature 2416 is etched subsequent to the first channel feature 2414, as the etching solution 2406 is able to reach the second channel feature 2416 by way of the first channel feature 2414. Subsequently, the cavity 2402 can be etched, as the etching solution 2406 is able to reach the cavity 2402 by way of the previously etched channel features 2414, 2416.

Figure 25:
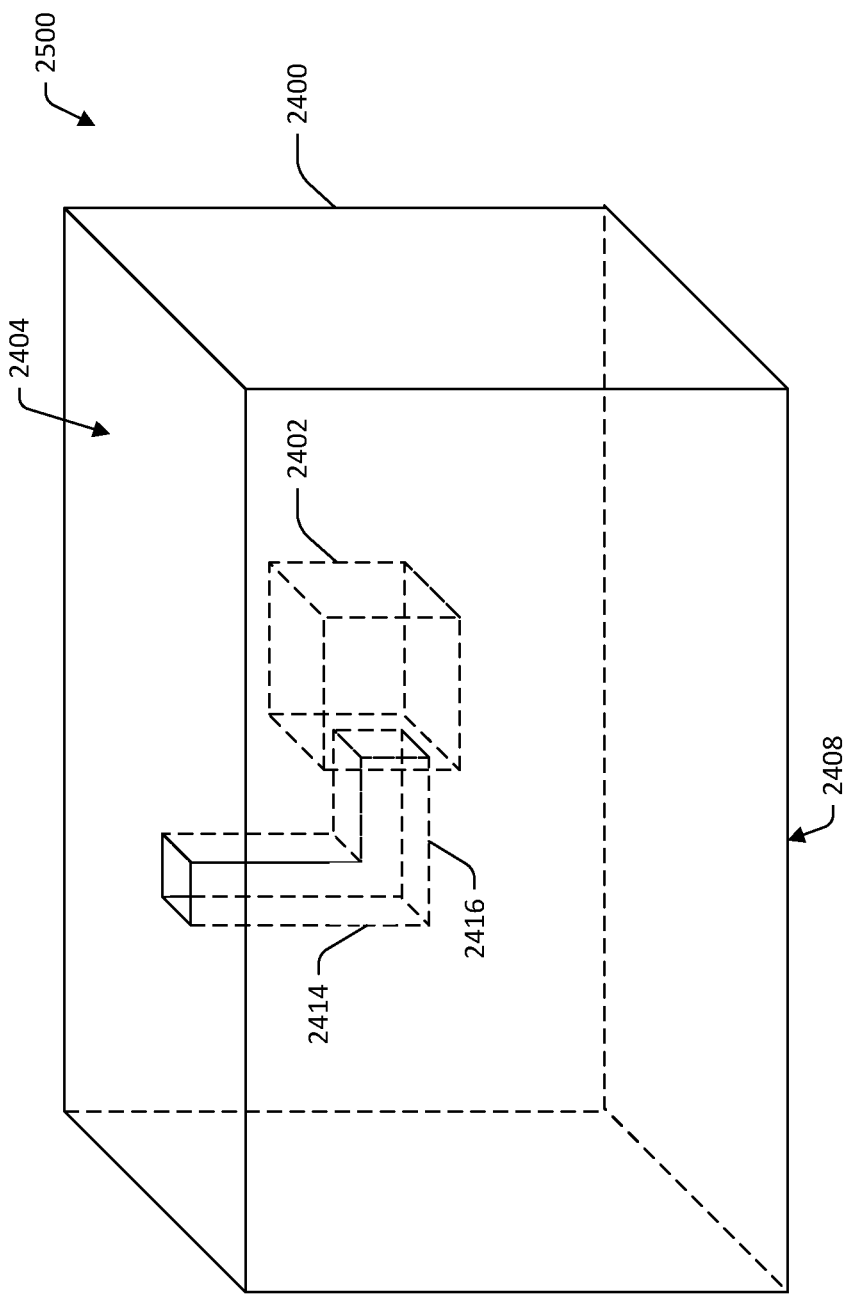
FIG. 25 is a three-dimensional representation of the sub-surface semiconductor etch depicted in FIG. 24.

It is to be understood that while various aspects pertaining to etched features are depicted in the Figures in two-dimensional form to facilitate understanding, the technologies described herein are suitable for etching features of substantially any shape in three dimensions. Referring now to FIG. 25, a three-dimensional representation 2500 of the etched features 2402, 2414, 2416 illustrated in FIG. 24 is shown. In the three-dimensional representation 2500, the semiconductor 2400 is shown to have a rectangular cubic shape. The first channel feature 2414 is a rectangular channel feature extending from the frontside surface 2404 into the body of the semiconductor 2400. The second channel feature 2416 is also a rectangular channel feature and extends horizontally outward from the first channel feature 2414 in the body of the semiconductor 2400. The cavity 2402 is shown to be a cubic cavity that connects with the second channel feature 2416, and thereby is connected to the frontside surface 2404 of the semiconductor 2400 by way of the two channel features 2414, 2416.

Referring once again to FIG. 19, the process control component 1942 can further control temperature and composition of the etching solution 1910 to maintain desired etch parameters. The system 1900 further comprises a composition controller 1950 and a temperature controller 1952 in communication with the computing device 1906. The composition controller 1950 is coupled to the interior of the first containment vessel 1914 by way of an opening 1954 in the containment vessel 1914. The composition controller 1950 can be controlled by the process control component 1942 to remove by-products of the etching reaction from the first containment vessel 1914 and/or to introduce additional etching solution to maintain a target composition of the etching solution 1910 within the containment vessel 1914. In other embodiments, the composition controller 1950 can be controlled by the process control component 1942 to maintain a desired pressure in the containment vessel 1914 in order to prevent the formation of bubbles of gases generated during the etch process. By way of example, gases such as hydrogen or silicon tetrafluoride may be given off during an etch process, and bubbles of such gas can become trapped within a structure being etched into the semiconductor 1908. The composition controller 1950 can maintain a pressure in the containment vessel 1914 to prevent the formation of such bubbles, which can have deleterious effects on the etch process. The temperature controller 1952 is coupled to heating/cooling device 1956 that is positioned within the containment vessel 1914. Responsive to receipt of control signals from the computing device 1906, the temperature controller 1952 controls the heating/cooling device 1956 to heat or cool the etching solution 1910 in the containment vessel 1914 so as to maintain a target temperature of the etching solution 1910 (e.g., as indicated in the control signals transmitted to the temperature controller 1952 by the computing device 1906).

It is to be understood that any or all of various forces, parameters, and variables described herein may affect migration of holes within the semiconductor 1908. It will therefore be the case that holes created at one position may migrate to another position subject to a large number of variable physical parameters (e.g., temperature, voltage between electrodes 1922, 1924, size, intensity, and position of the focal spot 1944, composition of the semiconductor 1908, etc.). To facilitate etching of the semiconductor 1908 according to a desired etch pattern, the memory 1938 includes an etch modeling component 1958 that outputs etch control instructions to the process control component 1942 based upon an etch definition input to the computing device 1906. Furthermore, feedback can be introduced into the control algorithm by monitoring the electrical current I flowing in the electrochemical etch cell (which is related to the rate of etching occurring), monitoring the current temperature of the etching solution 1910, monitoring the products resulting from the etch process (e.g., as identified by the composition controller 1950), or monitoring an image of the etch front as the etch proceeds.

Exemplary operations of the etch modeling component 1958 and process control component 1942 in connection with etching the semiconductor 1908 according to a desired pattern are now described. An etch definition is provided to the etch modeling component 1958, where the etch definition is indicative of position and dimensions of various features desirably etched in the semiconductor 1908. Stated differently, the etch definition indicates a plurality of locations at which it is desired (e.g., by an operator of the system 1900) that the semiconductor 1908 be etched, wherein taken together the plurality of locations define the structure of one or more features to be etched. In exemplary embodiments, the etch definition comprises a computer-aided design (CAD) model that indicates dimensions of a semiconductor and respective positions and dimensions for one or more etch features in the semiconductor. The etch definition input to the etch modeling component 1958 can further include one or more desired parameters of the etch. By way of example, and not limitation, the etch definition can include data indicative of a composition of the semiconductor 1908, locations of existing etched features in the semiconductor 1908, desired operating parameters of the laser 1904 and/or the voltage source 1920, etc.

The etch modeling component 1958 is configured to output etch control instructions to the process control component 1942 based upon the etch definition. The etch control instructions define control parameters for various aspects of the system 1900 that are employed by the process control component 1942 in connection with performing the desired etch described in the etch definition. In an exemplary embodiment, the etch control instructions include a plurality of positions of the focal spot 1944 of the laser 1904. In other examples, the etch control instructions can include data indicative of a composition of the etching solution 1910, a temperature of the etching solution 1910, a voltage output of the voltage source 1920, etc.

In the exemplary system 1900, the beam 1909 is emitted into the backside surface 1928 of the semiconductor 1908 to avoid scattering of the beam 1909 by already-etched features in the semiconductor 1908, such as the feature 1946. Scattering of the beam 1909 by etched features in the semiconductor 1908 can usually by avoided by illumination the semiconductor 1908 with the laser 1904 from the backside 1928 and etching features nearest the etching surface 1912 first before etching features that are further away from the etching surface 1912. However, for more complicated three-dimensional structures, it may be necessary to etch features in a different order to avoid scattering of the beam 1909. The etch modeling component 1958 can be configured to generate the etch control instructions in order to minimize occasions of the beam 1909 crossing an already-etched feature in the semiconductor 1908.

In exemplary embodiments, the etch modeling component 1958 generates the etch control instructions based upon a physics model 1960 that is configured to output predictions of migration of holes within the semiconductor 1908. In an example, a desired etch location is provided to the physics model 1960 (e.g., as indicated in an etch definition provided to the etch modeling component 1958) and the physics model 1960 outputs a prediction that comprises an illumination location, wherein the prediction indicates that a hole generated at the illumination location is expected to migrate to the desired etch location. Stated differently, the physics model 1960 receives a location of desired etching of the semiconductor 1908 and outputs a prediction of where the focal spot 1944 of the laser 1904 can be positioned to result in the desired etch.

The physics model 1960 generates an illumination location prediction for a desired etch location based upon various parameters that affect motion of holes in the semiconductor 1908. Such physical effects include, but are not limited to, charge-carrier diffusion, an induced electric field within the semiconductor 1908 (e.g., as caused by a voltage established between the electrodes 1922, 1924), a current flow/through an electrochemical cell that comprises the conductive material 1926, the semiconductor 1908, the etching solution 1910, the electrodes 1922, 1924, and the voltage source 1920, etc. In connection with generating an illumination location prediction, the physics model 1960 can further model effects due to these parameters based on other underlying data that may affect a modeled physical process. For example, the physics model 1960 can model effects of charge-carrier diffusion based on a composition of the semiconductor 1908 and concentrations of dopants or other impurities in the semiconductor 1908. In another example, the physics model 1960 can model effects of an induced electric field based upon a voltage applied between the electrodes 1922, 1924.

The physics model 1960, in addition to receiving data pertaining to desired etch parameters (e.g., as specified in an etch definition submitted to the etch modeling component 1958), receives data pertaining to a present state of one or more operating parameters of the system 1900. For example, the process control component 1942 can in real-time output data to the physics model 1960, the data indicative of the current flow I, the current flow I indicative of a reaction rate of the etching reaction (e.g., the reaction described by Equations 1 and 2 above). Hence, the physics model 1960 can continually generate updated predictions of illumination locations for desirably etched features based on data pertaining to a current state of the system 1900. The etch modeling component 1958 can generate updated control instructions based upon the predictions and transmit the updated control instructions to the process control component 1942 to facilitate control of the system 1900 by the process control component 1942 based on up-to-date information about system state.

In other exemplary embodiments, the physics model 1960 can be configured to generate an illumination location prediction based upon simulation results 1962 that are stored in the data store 1940. In an embodiment, the simulation results 1962 include results of a large number (e.g., hundreds or thousands or more) of simulated etches of a semiconductor according to various etch parameters. The physics model 1960 can be configured to execute machine learning algorithms over the simulation results 1962 to identify results of a simulated etch that exhibit a similar etch pattern to a desired etch indicated in an etch definition received by the etch modeling component 1958. The physics model 1960 can then output an illumination location prediction based on the identified results.

While certain examples of physical effects that are modeled by the physics model 1960 are described herein, it is contemplated that the physics model 1960 can model substantially any physical process that can affect a resultant etch location of holes generated by the focal spot 1944 of the laser 1904 at an illumination location.

It is to be understood that the systems and methods for selective electrochemical etching of various semiconductors are suitable for etching features of various sizes. For example, features can be etched in accordance with the technologies described herein to have a size on the order of 10 nanometers to 1 micron, on the order of 10 microns to 1 millimeter, or features of arbitrarily large size.

Figure 26:
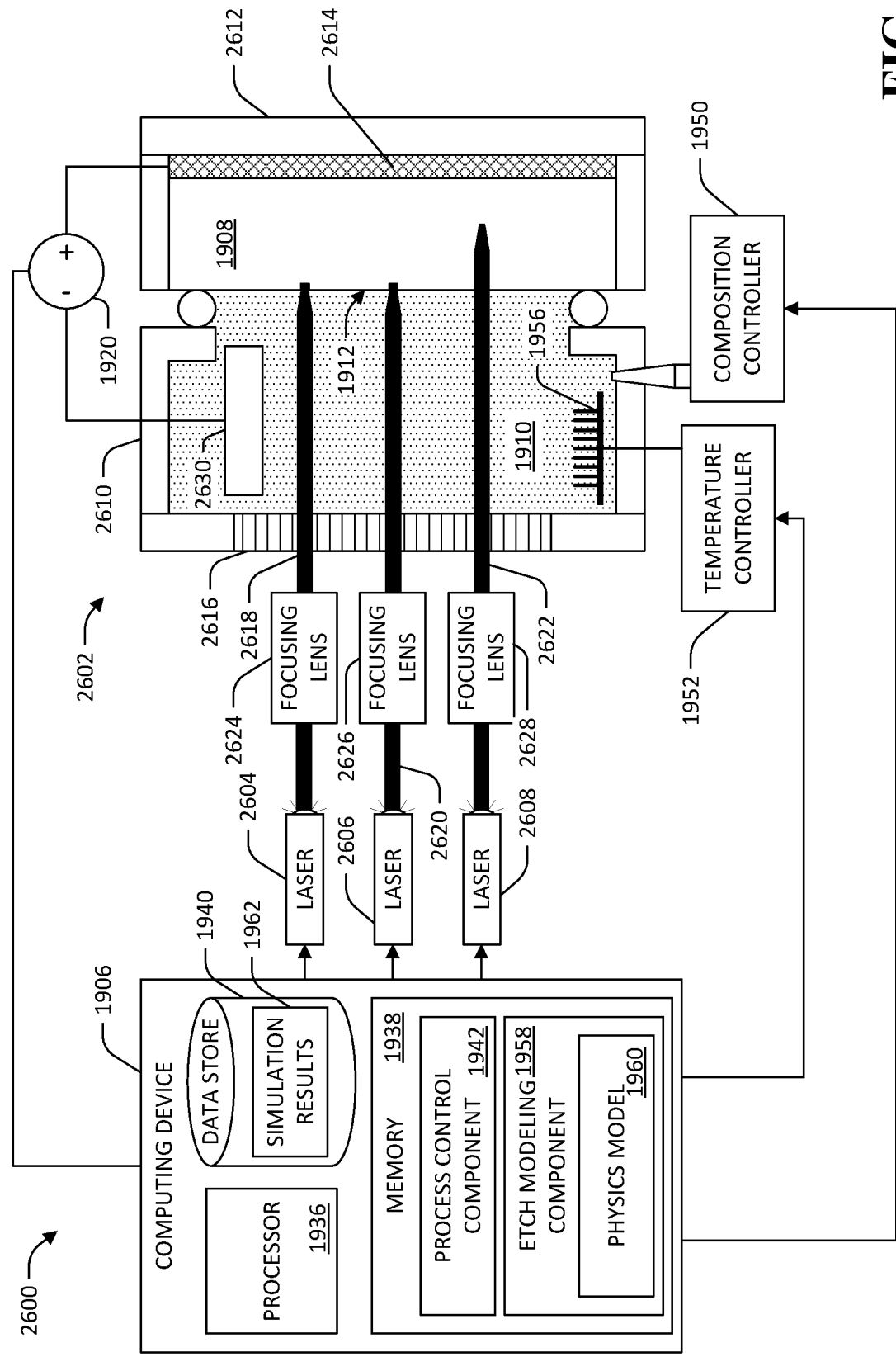
FIG. 26 is a diagram of another exemplary system that facilitates selective etching of a semiconductor controlled by a plurality of sub-bandgap-energy lasers.

While various aspects pertaining to an exemplary system 1900 operable in connection with selective etching of a semiconductor are described in detail above, it is to be understood that other configurations are possible and contemplated as being within the scope of the present disclosure. Referring now to FIG. 26, another exemplary system 2600 is shown wherein the semiconductor 1908 is contained in an etching chamber 2602 that is configured for frontside illumination by a plurality of sub-bandgap-energy lasers 2604-2608. The etching chamber 2602 includes a first containment vessel 2610 that contains the etching solution 1910 and a second containment vessel 2612 that contains the semiconductor 1908 and a conductive element 2614. The first containment vessel 2610 further comprises a window 2616 through which beams 2618-2622 emitted by respective lasers 2604-2608 are focused by respective focusing lenses 2624-2628 toward the frontside etching surface 1912 of the semiconductor 1908. It is to be understood that while the beams 2618-2622 are emitted toward the frontside surface 1912 of the semiconductor 1908, the beams 2618-2622 may be focused to respective focal spots within a body of the semiconductor 1908 and underneath the surface 1912. In the exemplary system 2600, the voltage source 1920 is connected between the conductive element 2614 that makes electrical contact with the backside 1928 of the semiconductor 1908 and an electrode 2630 that is positioned in the first containment vessel 2610.

The process control component 1942 of the computing device 1906 can be configured to independently control the plurality of lasers 2604-2608 in order to facilitate faster etching of the semiconductor 1908. For instance, since etching of the semiconductor 1908 by the etching solution 1910 is driven by holes that facilitate the etching reaction, simultaneous generation of holes at multiple locations in the semiconductor 1908 by the lasers 2604-2608 enables several features to be etched simultaneously. It is to be understood that substantially any number of lasers may be included in a system for selective electrochemical etching of a semiconductor and controlled by the process control component 1942. In other example it may be desirable for the process control component 1942 to control a plurality of lasers to operate in parallel such that a same feature may be simultaneously etched a plurality of times in the semiconductor 1908.

Figure 27:
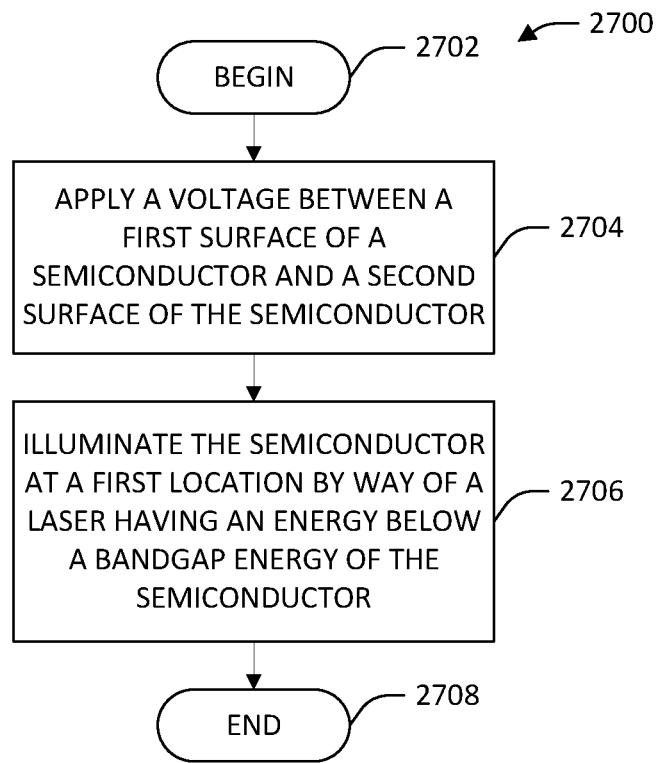
FIG. 27 is a flow diagram that illustrates an exemplary methodology for selective semiconductor etching controlled by a sub-bandgap-energy laser.

FIG. 27 illustrates an exemplary methodology relating to selective semiconductor etching driven by sub-bandgap-energy illumination of the semiconductor. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

Moreover, some of the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodology can be stored in a computer-readable medium, displayed on a display device, and/or the like.

Referring now to FIG. 27, a methodology 2700 that facilitates selective etching of a semiconductor by sub-bandgap-energy illumination of the semiconductor is illustrated. The methodology 2700 begins at 2702, and at 2704 a voltage is applied between a first surface of a semiconductor and a second surface of the semiconductor. By way of example, the voltage can be applied between the first surface and the second surface by applying a voltage between electrodes that are immersed in conductive solutions that respectively make contact with the first and second surfaces of the semiconductor (e.g., the electrodes 1922, 1924 shown in the exemplary system 1900). At 2706, the semiconductor is illuminated at a first location by way of a laser that emits light that has an energy below a bandgap energy of the semiconductor. The laser is focused to a focal spot sufficiently intense to cause a hole to be generated at the first location in the semiconductor, wherein etching of the semiconductor occurs at a second location based upon the hole being generated at the first location. The methodology then ends at 2708.

Figure 28:
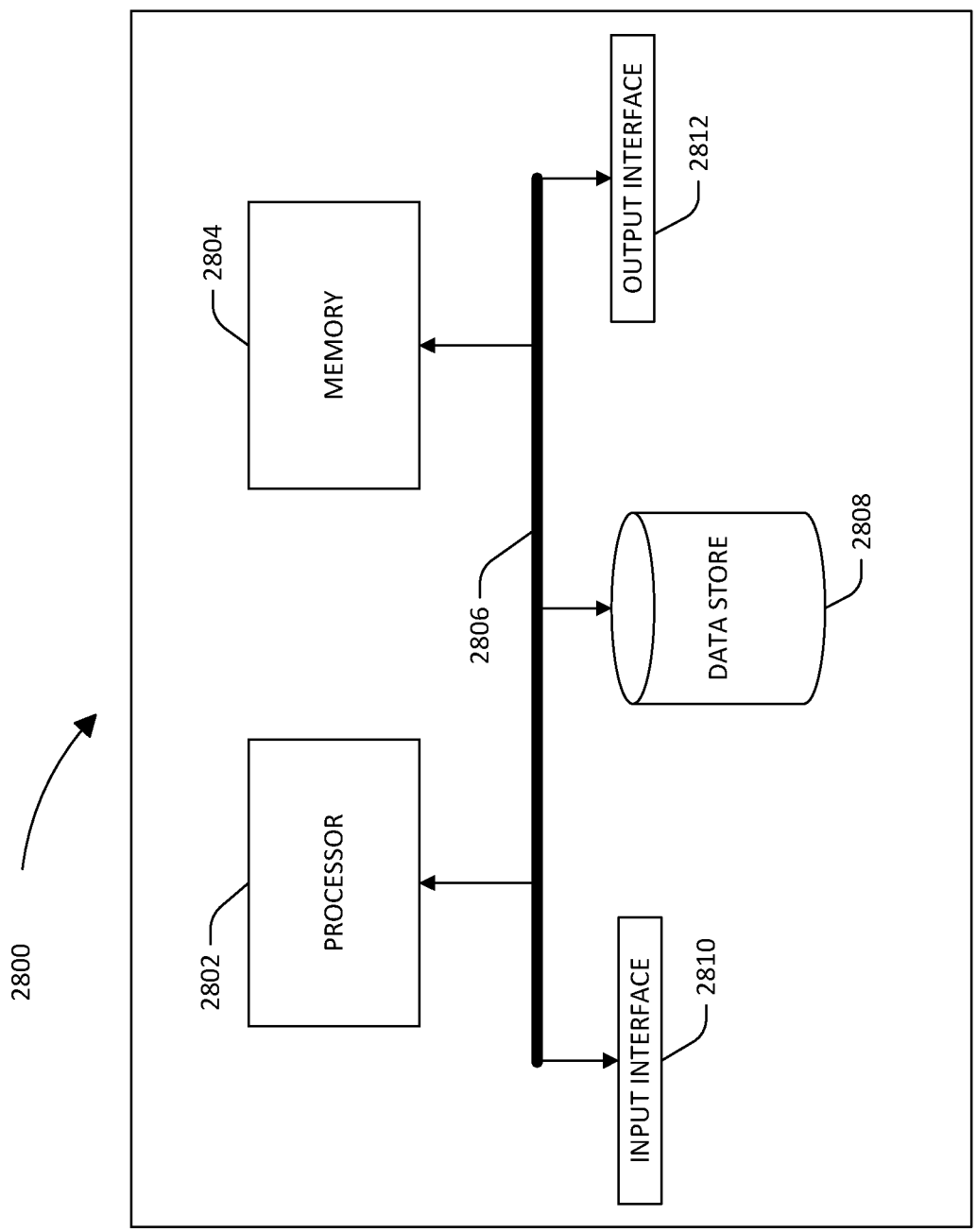
FIG. 28 is an exemplary computing system.

Referring now to FIG. 28, a high-level illustration of an exemplary computing device 2800 that can be used in accordance with the systems and methodologies disclosed herein is illustrated. For instance, the computing device 2800 may be used in a system that controls operation of a system for selective semiconductor etching (e.g., the system 1900, the system 2600). By way of another example, the computing device 2800 can be used in a system that performs simulations of charge-carrier migration within a semiconductor based upon a physics model. The computing device 2800 includes at least one processor 2802 that executes instructions that are stored in a memory 2804. The instructions may be, for instance, instructions for implementing functionality described as being carried out by one or more components discussed above or instructions for implementing one or more of the methods described above. The processor 2802 may access the memory 2804 by way of a system bus 2806. In addition to storing executable instructions, the memory 2804 may also store simulation results, etching definitions, states of various process parameters of a selective etching system, etc.

The computing device 2800 additionally includes a data store 2808 that is accessible by the processor 2802 by way of the system bus 2806. The data store 2808 may include executable instructions, simulation results, etc. The computing device 2800 also includes an input interface 2810 that allows external devices to communicate with the computing device 2800. For instance, the input interface 2810 may be used to receive instructions from an external computer device, from a user, etc. The computing device 2800 also includes an output interface 2812 that interfaces the computing device 2800 with one or more external devices. For example, the computing device 2800 may display text, images, etc. by way of the output interface 2812.

It is contemplated that the external devices that communicate with the computing device 2800 via the input interface 2810 and the output interface 2812 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like and provide output on an output device such as a display. Further, a natural user interface may enable a user to interact with the computing device 2800 in a manner free from constraints imposed by input device such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing device 2800 may be a distributed system. Thus, for instance, several devices may be in communication by way of a network connection and may collectively perform tasks described as being performed by the computing device 2800.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A semiconductor device, where the semiconductor device is an interposer, and further where the semiconductor device comprises:
 a bulk semiconductor element having a first surface and a second surface;
 a waveguide disposed within the bulk semiconductor element, wherein the waveguide comprises a first end and a second end, and wherein the first end terminates on the first surface of the bulk semiconductor element, and wherein further the second end terminates on the first surface or the second surface of the bulk semiconductor element such that the second end is laterally offset from the first end;
 a channel disposed within the bulk semiconductor element, the channel having an inlet and an outlet, the channel configured to accommodate a fluid, wherein the inlet of the channel terminates on the first surface of the bulk semiconductor element, and further wherein the outlet of the channel terminates on the first surface or the second surface of the bulk semiconductor element such that the outlet is laterally offset from the inlet; and
 a via disposed within the bulk semiconductor element, the via comprising an electrically conductive material, the via having a first terminal portion and a second terminal portion, wherein the first terminal portion terminates on the first surface of the bulk semiconductor element, and wherein the second terminal portion terminates on the first surface or the second surface of the bulk semiconductor element such that the second terminal portion is laterally offset from the first terminal portion.

2. The semiconductor device of claim 1, wherein the waveguide has a c-shaped cross-section.

3. The semiconductor device of claim 1, the waveguide having an interior surface, the interior surface of the waveguide being cladded with a material having a first index of refraction, and wherein the bulk semiconductor element has a second index of refraction, the second index of refraction being higher than the first index of refraction.

4. The semiconductor device of claim 1, the waveguide being a first waveguide, the semiconductor device further comprising:
 a second bulk semiconductor element; and
 a second waveguide disposed within the second bulk semiconductor element, the second bulk semiconductor element positioned proximally to the first bulk semiconductor element such that light in the second waveguide couples to the first waveguide.

5. The semiconductor device of claim 4, wherein the light in the second waveguide couples to the first waveguide by way of evanescent coupling.

6. The semiconductor device of claim 4, wherein the light in the second waveguide couples to the first waveguide by way of end coupling.

7. A semiconductor device comprising:
a bulk semiconductor element having a first surface and a second surface;
a channel disposed within the bulk semiconductor element, the channel having an inlet and an outlet, the channel configured to accommodate a fluid, wherein the inlet of the channel terminates on the first surface of the bulk semiconductor element, and further wherein the outlet of the channel terminates on the first surface or the second surface of the bulk semiconductor element such that the outlet is laterally offset from the inlet, the channel having a void formed therein; and
a turbine positioned within the void, the turbine configured such that when the turbine is rotated, the turbine pumps a fluid from the inlet of the channel to the outlet of the channel.

8. The semiconductor device of claim 7, wherein the semiconductor device is an interposer, and wherein the semiconductor device further comprises:
a waveguide disposed within the semiconductor bulk element, wherein the waveguide comprises a first end and a second end, and wherein the first end terminates on the first surface of the bulk semiconductor element, and wherein further the second end terminates on the first surface or the second surface of the bulk semiconductor element such that the second end is laterally offset from the first end; and
a via disposed within the bulk semiconductor element, the via comprising an electrically conductive material, the via having a first terminal portion and a second terminal portion, wherein the first terminal portion terminates on the first surface of the bulk semiconductor element, and wherein the second terminal portion terminate on the first surface or the second surface of the bulk semiconductor element such that the second terminal portion is laterally offset from the first terminal portion.

9. The semiconductor device of claim 7, further comprising an expansion nozzle positioned in the channel, the expansion nozzle formed from material of the bulk semiconductor element.

10. The semiconductor device of claim 9, further comprising a circuit element deposited on a surface of the bulk semiconductor element, the surface being one of the first surface, the second surface, or a third surface of the bulk semiconductor element, the circuit element positioned above an outlet of the expansion nozzle.

11. The semiconductor device of claim 7, wherein the turbine comprises a boundary-layer turbine.

12. A semiconductor device comprising:
a bulk semiconductor element having a first surface and a second surface; and
a via disposed within the bulk semiconductor element, the via comprising an electrically conductive material, the via having a first terminal portion and a second terminal portion, wherein the first terminal portion terminates on the first surface of the bulk semiconductor element, and wherein the second terminal portion terminate on the first surface or the second surface of the bulk semiconductor element such that the second terminal portion is laterally offset from the first terminal portion; and
a capacitor disposed within the bulk semiconductor element, the capacitor having a first terminal and a second terminal, each of the first terminal and the second terminal being disposed on a respective one of the first surface, the second surface, or a third surface of the bulk semiconductor element.

13. The semiconductor device of claim 12, wherein the semiconductor device is an interposer, and wherein the semiconductor device further comprises:
a channel disposed within the bulk semiconductor element, the channel having an inlet and an outlet, the channel configured to accommodate a fluid, wherein the inlet of the channel terminates on the first surface of the bulk semiconductor element, and wherein further the outlet of the channel terminates on the first surface or the second surface of the bulk semiconductor element such that the outlet is laterally offset from the inlet; and
a waveguide disposed within the semiconductor bulk element, wherein the waveguide comprises a first end and a second end, and wherein the first end terminates on the first surface of the bulk semiconductor element, and wherein further the second end terminates on the first surface or the second surface of the bulk semiconductor element such that the second end is laterally offset from the first end.

14. The semiconductor device of claim 12, wherein the via further comprises a branch, wherein the branch terminates on one of the first surface, the second surface, or a third surface of the bulk semiconductor element.

15. The semiconductor device of claim 12, wherein the capacitor comprises:
a first conductive element;
a second conductive element;
a dielectric element disposed between the first conductive element and the second conductive element, and wherein the first conductive element, the second conductive element, and the dielectric element are arranged in a spiral configuration.

16. The semiconductor device of claim 12, wherein the capacitor comprises:
a first conductive element, the first conductive element comprising a first plurality of plates;
a second conductive element, the second conductive element comprising a second plurality of plates, the second plurality of plates interleaved between the first plurality of plates in an alternating pattern.

17. The semiconductor device of claim 12, further comprising:
an inductor disposed within the bulk semiconductor element, the inductor comprising a coil of conductive material, the inductor having a first terminal and a second terminal, each of the first terminal and the second terminal being disposed on a respective one of the first surface, the second surface, or a third surface of the bulk semiconductor element.

* * * * *